United States Patent
Chen et al.

(10) Patent No.: US 10,026,487 B2
(45) Date of Patent: Jul. 17, 2018

(54) NON-VOLATILE MEMORY WITH CUSTOMIZED CONTROL OF INJECTION TYPE OF DISTURB DURING PROGRAM VERIFY FOR IMPROVED PROGRAM PERFORMANCE

(71) Applicant: SANDISK TECHNOLOGIES LLC, Plano, TX (US)

(72) Inventors: Hong-Yan Chen, Sunnyvale, CA (US); Yingda Dong, Los Altos, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/172,653

(22) Filed: Jun. 3, 2016

(65) Prior Publication Data

US 2017/0352430 A1   Dec. 7, 2017

(51) Int. Cl.
| | |
|---|---|
| *G11C 16/34* | (2006.01) |
| *G11C 16/04* | (2006.01) |
| *G11C 16/08* | (2006.01) |
| *G11C 16/10* | (2006.01) |
| *G11C 16/26* | (2006.01) |
| *G11C 16/16* | (2006.01) |

(52) U.S. Cl.
CPC ...... *G11C 16/3431* (2013.01); *G11C 16/0483* (2013.01); *G11C 16/08* (2013.01); *G11C 16/10* (2013.01); *G11C 16/16* (2013.01); *G11C 16/26* (2013.01); *G11C 16/3427* (2013.01)

(58) Field of Classification Search
CPC ............ G11C 16/0483; G11C 16/3418; G11C 16/3427; G11C 16/3431

USPC ............ 365/185.17, 185.02, 185.11, 185.22
See application file for complete search history.

(56) References Cited

U.S. PATENT DOCUMENTS

| | | | |
|---|---|---|---|
| 6,163,048 | A | 12/2000 | Hirose |
| 6,614,070 | B1 | 9/2003 | Hirose |
| 6,707,714 | B2 | 3/2004 | Kawamura |
| 7,170,785 | B2 | 1/2007 | Yeh |
| 7,440,318 | B2 | 10/2008 | Fong |

(Continued)

OTHER PUBLICATIONS

Chen, et al., "Non-Volatile Memory With Customized Control of Injection Type of Disturb During Read Operations," U.S. Appl. No. 15/172,671, filed Jun. 3, 2016.

(Continued)

*Primary Examiner* — Alexander Sofocleous
*Assistant Examiner* — Alfredo Bermudez Lozada
(74) *Attorney, Agent, or Firm* — Vierra Magen Marcus LLP

(57) ABSTRACT

A non-volatile memory system includes one or more control circuits configured to program memory cells and verify the programming. The verifying of the programmed memory cells includes applying one or more voltages to perform boosting of a channel region associated with unselected memory cells, allowing the boosting of the channel region for a portion of time while applying the one or more voltages, preventing/interrupting the boosting of the channel region while applying the one or more voltages for a duration of time based on position of a memory cell selected for verification, applying a compare signal to the memory cell selected for verification, and performing a sensing operation for the memory cell selected for verification in response to the compare signal.

20 Claims, 15 Drawing Sheets

(56) References Cited

U.S. PATENT DOCUMENTS

| | | |
|---|---|---|
| 7,505,322 B2 | 3/2009 | Lee |
| 7,515,463 B2 | 4/2009 | Hemink |
| 7,623,385 B2 | 11/2009 | Kim |
| 9,171,632 B2 | 10/2015 | Dong |
| 9,336,892 B1 | 5/2016 | Chen |
| 9,361,993 B1 | 6/2016 | Chen |
| 2007/0127291 A1* | 6/2007 | Fong ............ G11C 16/3427 365/185.17 |
| 2008/0137426 A1* | 6/2008 | Dong ............ G11C 16/0483 365/185.18 |
| 2009/0268524 A1 | 10/2009 | Maejima |
| 2010/0232224 A1 | 9/2010 | Maeda |
| 2011/0019486 A1 | 1/2011 | Jang |
| 2011/0267887 A1 | 11/2011 | Sekar |
| 2011/0317489 A1 | 12/2011 | Kim |
| 2012/0300550 A1 | 11/2012 | Hemink |
| 2013/0201760 A1* | 8/2013 | Dong ............ G11C 11/5642 365/185.17 |
| 2016/0148691 A1 | 5/2016 | Rabkin |

OTHER PUBLICATIONS

Notice of Allowance dated Feb. 7, 2017, U.S. Appl. No. 15/172,671.

Office Action dated Mar. 24, 2017, U.S. Appl. No. 15/172,671.

PCT International Search Report dated May 23, 2017, PCT Patent Application No. PCT/US2017/018636.

PCT Written Opinion of the International Searching Authority dated May 23, 2017, PCT Patent Application No. PCT/US2017/018636.

PCT International Search Report dated Jun. 6, 2017, PCT Patent Application No. PCT/US2017/018758.

PCT Written Opinion of the International Searching Authority dated Jun. 6, 2017, PCT Patent Application No. PCT/US2017/018636.

Response Office Action dated May 18, 2017, U.S. Appl. No. 15/172,671.

Notice of Allowance dated Jun. 5, 2017, U.S. Appl. No. 15/172,671.

\* cited by examiner

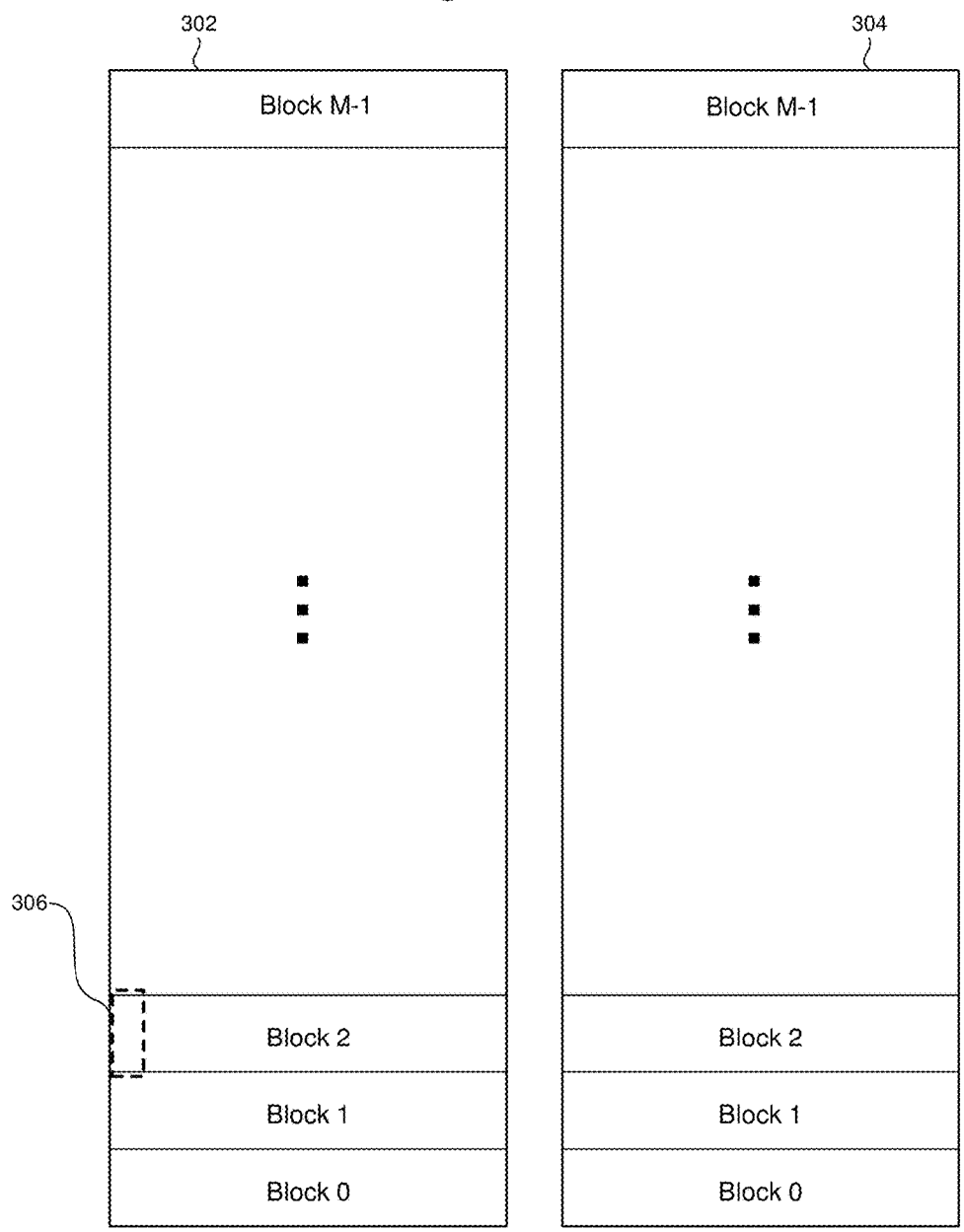

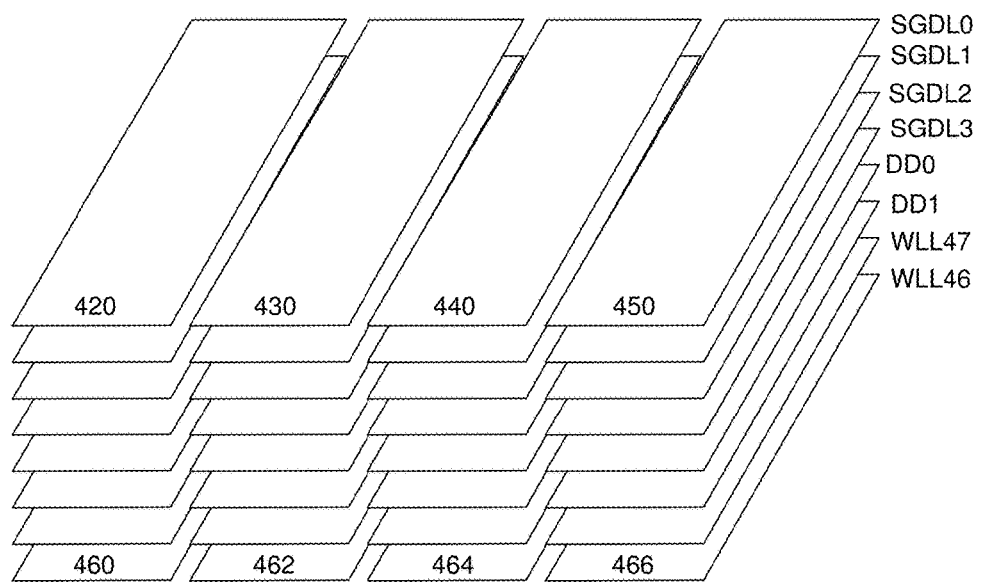
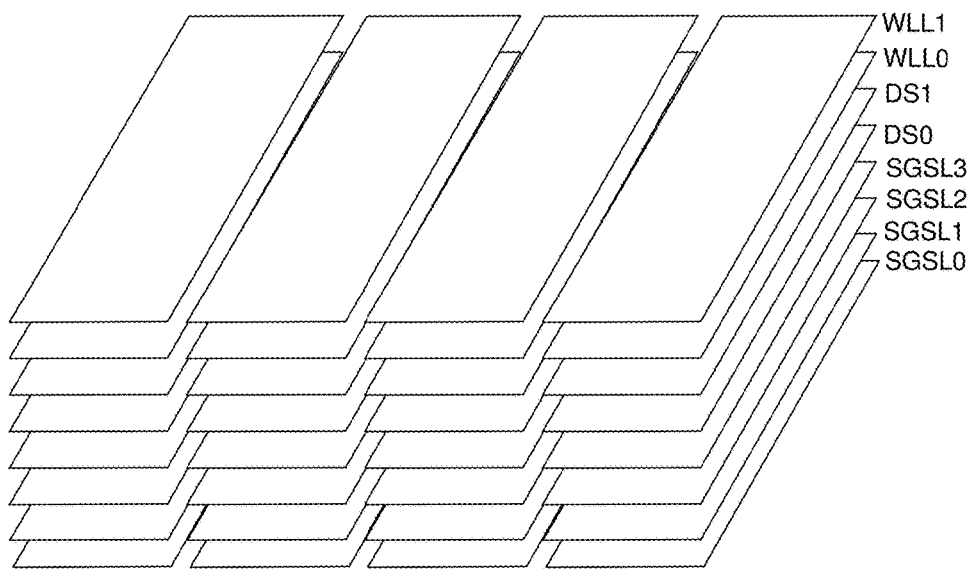
Figure 4D

|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

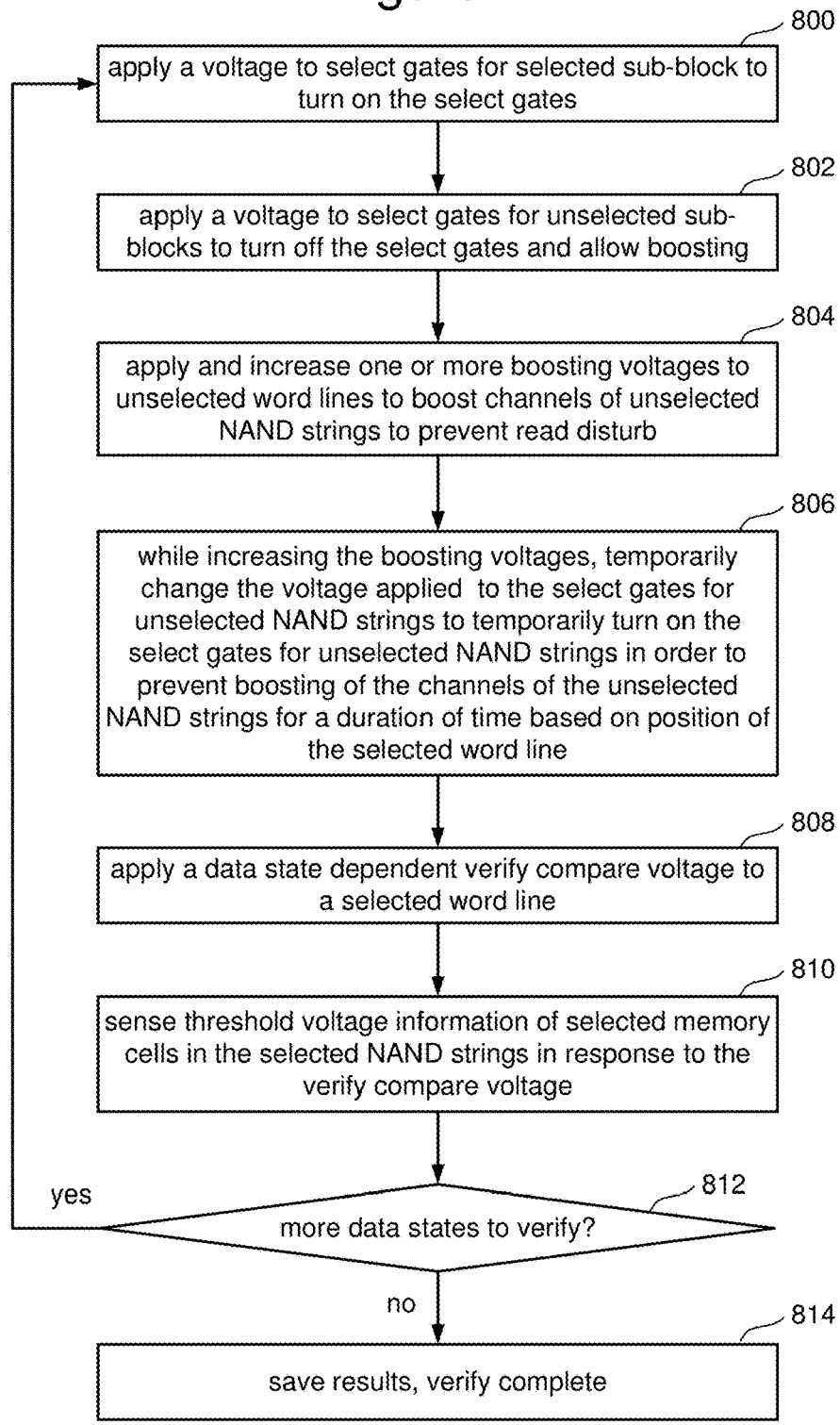

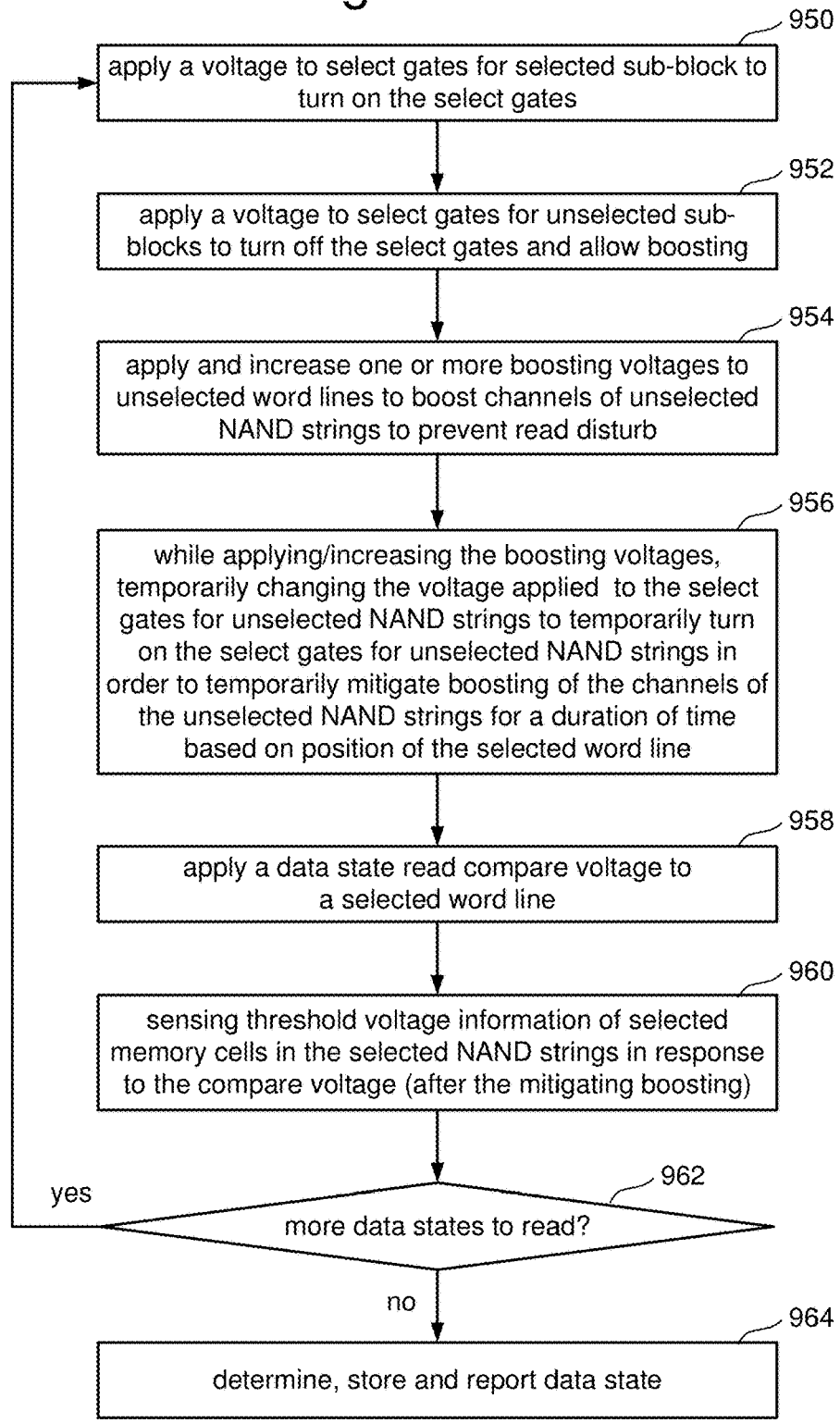

NON-VOLATILE MEMORY WITH CUSTOMIZED CONTROL OF INJECTION TYPE OF DISTURB DURING PROGRAM VERIFY FOR IMPROVED PROGRAM PERFORMANCE

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

A charge-trapping material can be used in non-volatile memory devices to store a charge which represents a data state. The charge-trapping material can be arranged vertically in a three-dimensional (3D) stacked memory structure. One example of a 3D memory structure is the Bit Cost Scalable (BiCS) architecture which comprises a stack of alternating conductive and dielectric layers. A memory hole is formed in the stack and a vertical NAND string is then formed by filling the memory hole with materials including a charge-trapping layer to create a vertical column of memory cells. Each memory cell can store one or more bits of data.

When a memory system is deployed in an electronic device, the memory system can be used to program data, read data and/or erase data.

BRIEF DESCRIPTION OF THE DRAWINGS

Like-numbered elements refer to common components in the different figures.

FIG. 4A is a block diagram of a memory structure having two planes.

FIG. 4D depicts a view of the select gate layers and word line layers.

FIG. 7 is a flow chart describing one embodiment of a process for verifying programming.

FIG. 10 is a flow chart describing one embodiment of a process for reading.

DETAILED DESCRIPTION

As part of the programming process, the memory system verifies that the programming was performed successfully. The process of verifying includes performing various sensing operations. To prevent disturbs to data during the sensing, the memory system boosts the channels of certain unselected memory cells. In some circumstances this boosting can result in a hot electron injection disturb; therefore, the boosting can be temporarily interrupted to mitigate the hot electron injection disturb. However, interrupting the boosting can slow down the verify process and not all memory cells need the same amount of interruption. Therefore, it is proposed to customize the interrupting of the boosting based on position of the memory cell in order to minimize the interruption used and mitigate performance issues.

One example embodiment includes one or more control circuits configured to program memory cells and verify the programming. The verifying of the programmed memory cells includes applying one or more voltages to perform boosting of a channel region associated with an unselected memory cell, allowing the boosting of the channel region for a portion of time while applying the one or more voltages, preventing/interrupting the boosting of the channel region while applying the one or more voltages for a duration of time based on position of a memory cell selected for verification, applying a compare signal to the memory cell selected for verification, and performing a sensing operation for the memory cell selected for verification in response to the compare signal.

Figure 1:
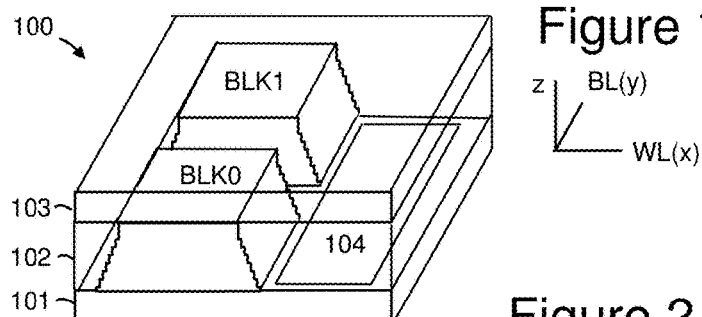
FIG. 1 is a perspective view of a 3D stacked non-volatile memory device.

FIGS. 1-4F describe one example of a memory system that can be used to implement the technology proposed herein. FIG. 1 is a perspective view of a three dimensional (3D) stacked non-volatile memory device. The memory device 100 includes a substrate 101. On and above the substrate are example blocks BLK0 and BLK1 of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

Figure 2:
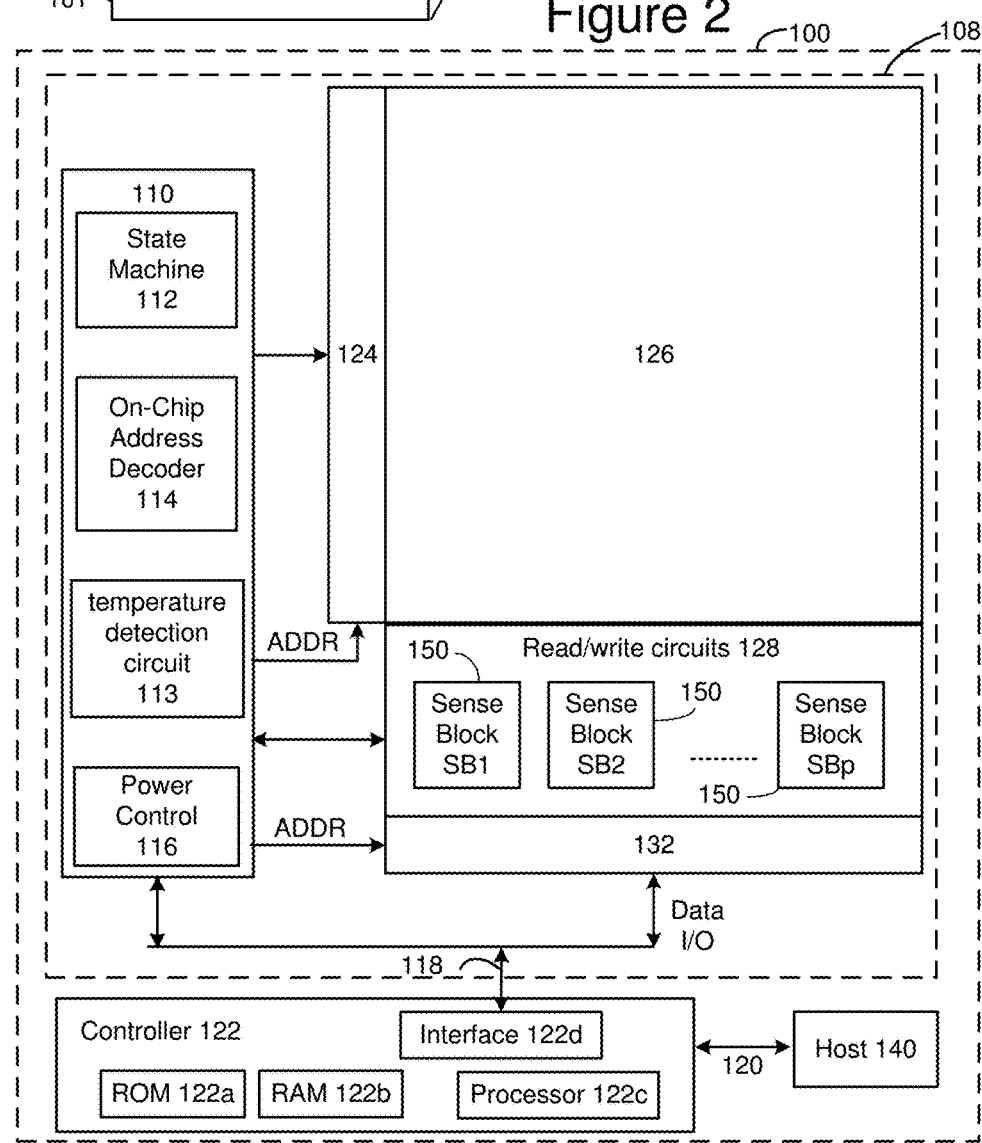
FIG. 2 is a functional block diagram of a memory device such as the 3D stacked non-volatile memory device 100 of FIG. 1.

FIG. 2 is a functional block diagram of an example memory device such as the 3D stacked non-volatile memory device 100 of FIG. 1. The components depicted in FIG. 2 are electrical circuits. Memory device 100 includes one or more memory die 108. Each memory die 108 includes a three dimensional memory structure 126 of memory cells (such as, for example, a 3D array of memory cells), control circuitry 110, and read/write circuits 128. In other embodiments, a two dimensional array of memory cells can be used. Memory structure 126 is addressable by word lines via a row decoder 124 and by bit lines via a column decoder 132. The read/write circuits 128 include multiple sense blocks 150 including SB1, SB2, . . . , SBp (sensing circuitry) and allow a page of memory cells to be read or programmed in parallel. In some systems, a Controller 122 is included in the same memory device 100 (e.g., a removable storage card) as the one or more memory die 108. However, in other systems, the Controller can be separated from the memory die 108. In some embodiments the Controller will be on a different die than the memory die. In some embodiments, one Controller 122 will communicate with multiple memory die 108. In other embodiments, each memory die 108 has its own Controller. Commands and data are transferred between the host 140 and Controller 122 via a data bus 120, and between Controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Control circuitry 110 cooperates with the read/write circuits 128 to perform memory operations (e.g., erase, program, read, and others) on memory structure 126, and includes a state machine 112, an on-chip address decoder 114, and a power control module 116. The state machine 112 provides chip-level control of memory operations. Temperature detection circuit 113 is configured to detect temperature, and can be any suitable temperature detection circuit known in the art. In one embodiment, state machine 112 is programmable by the software. In other embodiments, state machine 112 does not use software and is completely implemented in hardware (e.g., electrical circuits). In one embodiment, control circuitry 110 includes registers, ROM fuses and other storage devices for storing default values such as base voltages and other parameters.

The on-chip address decoder 114 provides an address interface between addresses used by host 140 or Controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, temperature detection circuit 113, power control module 116, sense blocks 150, read/write circuits 128, and Controller 122 can be considered one or more control circuits (or a managing circuit) that performs the functions described herein.

The (on-chip or off-chip) Controller 122 (which in one embodiment is an electrical circuit) may comprise a processor 122c, ROM 122a, RAM 122b and a Memory Interface 122d, all of which are interconnected. Processor 122C is one example of a control circuit. Other embodiments can use state machines or other custom circuits designed to perform one or more functions. The storage devices (ROM 122a, RAM 122b) comprises code such as a set of instructions, and the processor 122c is operable to execute the set of instructions to provide the functionality described herein. Alternatively or additionally, processor 122c can access code from a storage device in the memory structure, such as a reserved area of memory cells connected to one or more word lines. Memory interface 122d, in communication with ROM 122a, RAM 122b and processor 122c, is an electrical circuit that provides an electrical interface between Controller 122 and memory die 108. For example, memory interface 122d can change the format or timing of signals, provide a buffer, isolate from surges, latch I/O, etc. Processor 122C can issue commands to control circuitry 110 (or any other component of memory die 108) via Memory Interface 122d.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form vertical NAND strings that traverse across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
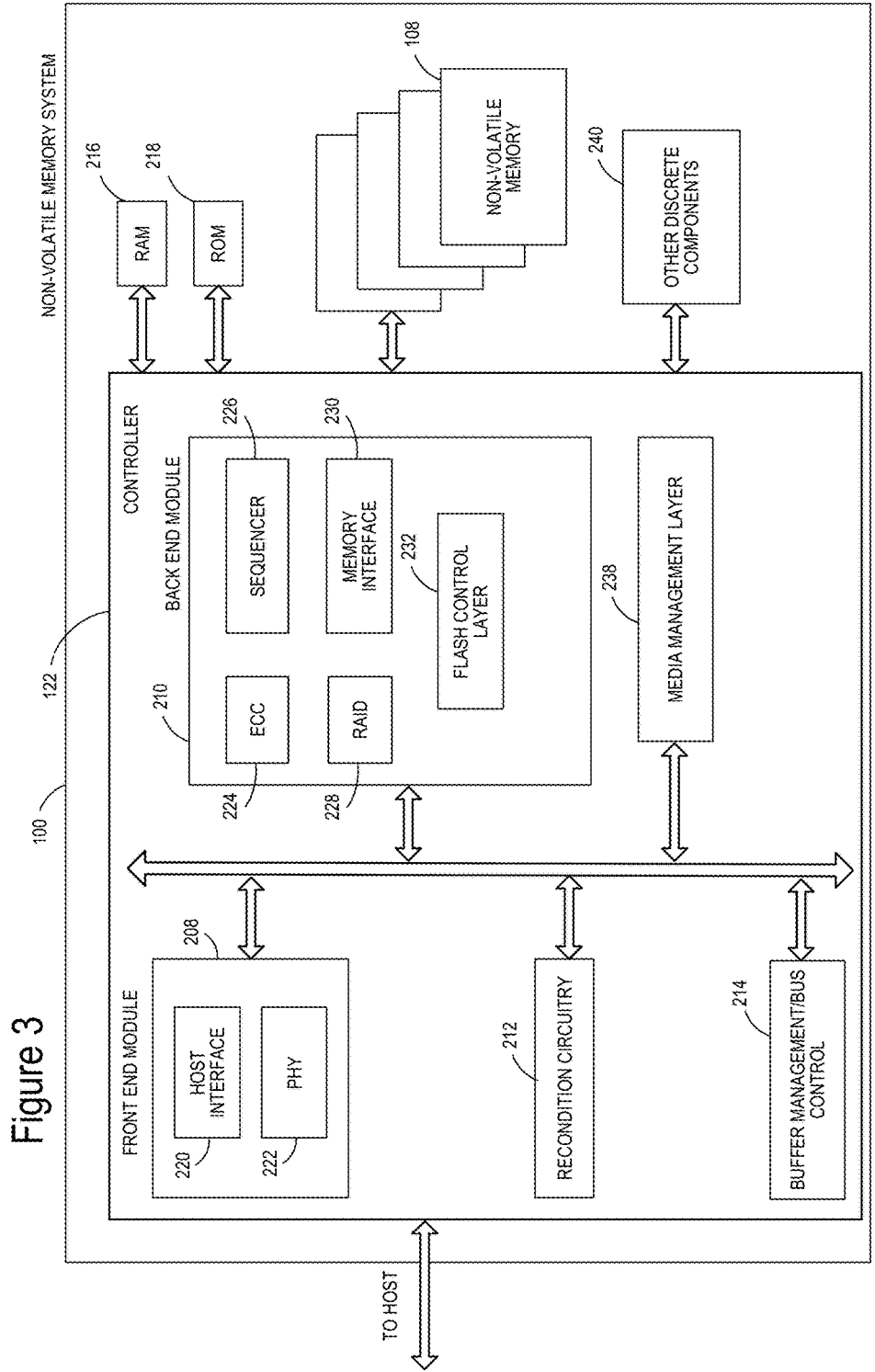
FIG. 3 is a block diagram depicting one embodiment of a Controller.

FIG. 3 is a block diagram of example memory system 100, depicting more details of Controller 122. As used herein, a flash memory Controller is a device that manages data stored on flash memory and communicates with a host, such as a computer or electronic device. A flash memory Controller can have various functionality in addition to the specific functionality described herein. For example, the flash memory Controller can format the flash memory to ensure the memory is operating properly, map out bad flash memory cells, and allocate spare memory cells to be substituted for future failed cells. Some part of the spare cells can be used to hold firmware to operate the flash memory Controller and implement other features. In operation, when a host needs to read data from or write data to the flash memory, it will communicate with the flash memory Controller. If the host provides a logical address to which data is to be read/written, the flash memory Controller can convert the logical address received from the host to a physical address in the flash memory. (Alternatively, the host can provide the physical address). The flash memory Controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between Controller 122 and non-volatile memory die 108 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host, such as in the form of a solid state disk (SSD) drive installed in a personal computer.

In some embodiments, non-volatile memory system 100 includes a single channel between Controller 122 and non-volatile memory die 108, the subject matter described herein is not limited to having a single memory channel. For example, in some memory system architectures, 2, 4, 8 or more channels may exist between the Controller and the memory die, depending on Controller capabilities. In any of the embodiments described herein, more than a single channel may exist between the Controller and the memory die, even if a single channel is shown in the drawings.

As depicted in FIG. 3, Controller 112 includes a front end module 208 that interfaces with a host, a back end module 210 that interfaces with the one or more non-volatile memory die 108, and various other modules that perform functions which will now be described in detail.

The components of Controller 122 depicted in FIG. 3 may take the form of a packaged functional hardware unit (e.g., an electrical circuit) designed for use with other components, a portion of a program code (e.g., software or firmware) executable by a (micro)processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for Controller 122 to perform the functions described herein. The architecture depicted in FIG. 3 is one example implementation that may (or may not) use the components of Controller 122 depicted in FIG. 2 (i.e. RAM, ROM, processor, interface).

Controller 122 may include recondition circuitry 212, which is used for reconditioning memory cells or blocks of memory. The reconditioning may include refreshing data in its current location or reprogramming data into a new word line or block as part of performing erratic word line maintenance, as described below.

Referring again to modules of the Controller 122, a buffer manager/bus Controller 214 manages buffers in random access memory (RAM) 216 and controls the internal bus arbitration of Controller 122. A read only memory (ROM) 218 stores system boot code. Although illustrated in FIG. 3 as located separately from the Controller 122, in other embodiments one or both of the RAM 216 and ROM 218 may be located within the Controller. In yet other embodiments, portions of RAM and ROM may be located both within the Controller 122 and outside the Controller. Further, in some implementations, the Controller 122, RAM 216, and ROM 218 may be located on separate semiconductor die.

Front end module 208 includes a host interface 220 and a physical layer interface (PHY) 222 that provide the electrical interface with the host or next level storage Controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction Controller (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

Additional components of system 100 illustrated in FIG. 3 include media management layer 238, which performs wear leveling of memory cells of non-volatile memory die 108. System 100 also includes other discrete components 240, such as external electrical interfaces, external RAM, resistors, capacitors, or other components that may interface with Controller 122. In alternative embodiments, one or more of the physical layer interface 222, RAID module 228, media management layer 238 and buffer management/bus Controller 214 are optional components that are not necessary in the Controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the flash memory 126 of die 108. The MML 238 may be needed because: 1) the flash memory may have limited endurance; 2) the flash memory 126 may only be written in multiples of pages; and/or 3) the flash memory 126 may not be written unless it is erased as a block. The MML 238 understands these potential limitations of the flash memory 126 which may not be visible to the host. Accordingly, the MML 238 attempts to translate the writes from host into writes into the flash memory 126. As described below, erratic bits may be identified and recorded using the MML 238. This recording of erratic bits can be used for evaluating the health of blocks and/or word lines (the memory cells on the word lines).

Controller 122 may interface with one or more memory dies 108. In one embodiment, Controller 122 and multiple memory dies (together comprising non-volatile storage system 100) implement a solid state drive (SSD), which can emulate, replace or be used instead of a hard disk drive inside a host, as a NAS device, etc. Additionally, the SSD need not be made to work as a hard drive.

In one embodiment, as discussed below with respect to FIGS. 7-12B, Controller 122 determines candidate bad blocks to test for usability based on previously recorded error codes, causes testing of the candidate bad blocks for usability, and causes storage of information in candidate blocks determined to be still usable.

Figure 4:
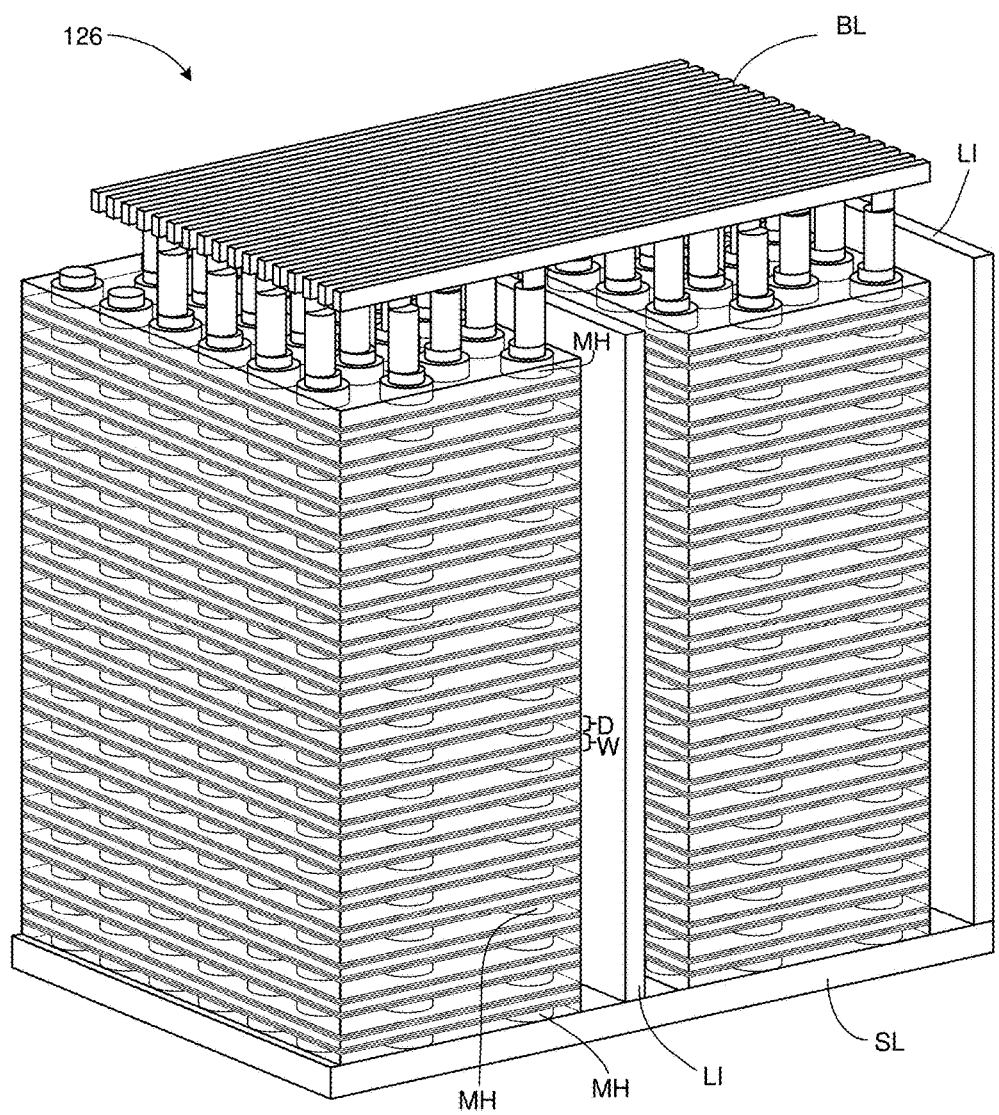
FIG. 4 is a perspective view of a portion of one embodiment of a three dimensional monolithic memory structure.

FIG. 4 is a perspective view of a portion of a monolithic three dimensional memory structure 126, which includes a plurality memory cells. For example, FIG. 4 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or less than 108-216 layers can also be used. As will be explained below, the alternating dielectric layers and conductive layers are divided into four "fingers" by local interconnects LI. FIG. 4 only shows two fingers and two local interconnects LI. Below and the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. More details of the three dimensional monolithic memory structure 126 is provided below with respect to FIG. 4A-4F.

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used. In one embodiment, for two plane memory, the block IDs are usually such that even blocks belong to one plane and odd blocks belong to another plane; therefore, plane 302 includes block 0, 2, 4, 6, . . . and plane 304 includes blocks 1, 3, 5, 7, . . . . In on embodiment, a block of memory cells is a unit of erase. That is, all memory cells of a block are erased together. In other embodiments, memory cells can be grouped into blocks for other reasons, such as to organize the memory structure 126 to enable the signaling and selection circuits.

Figure 4B:
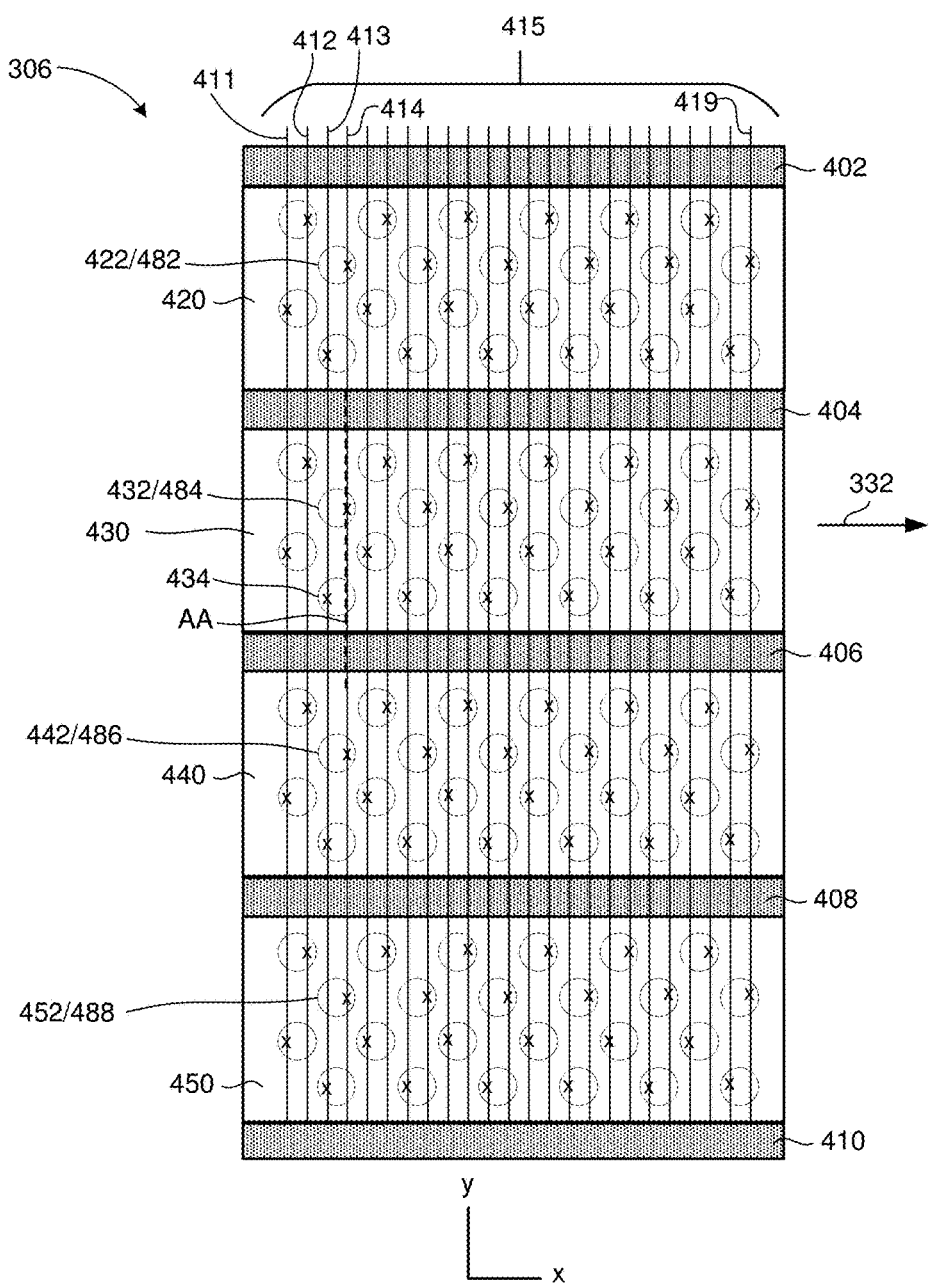
FIG. 4B depicts a top view of a portion of a block of memory cells.

FIGS. 4B-4F depict an example 3D NAND structure. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array will have 60 layers. Other embodiments have less than or more than 60 layers. However, FIG. 4B only shows the top layer.

FIG. 4B depicts a plurality of circles that represent the vertical columns. Each of the vertical columns include multiple select transistors and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 330 and in the direction of arrow 332, the block includes more vertical columns than depicted in FIG. 4B FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns.

Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side select lines and the drain side select lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
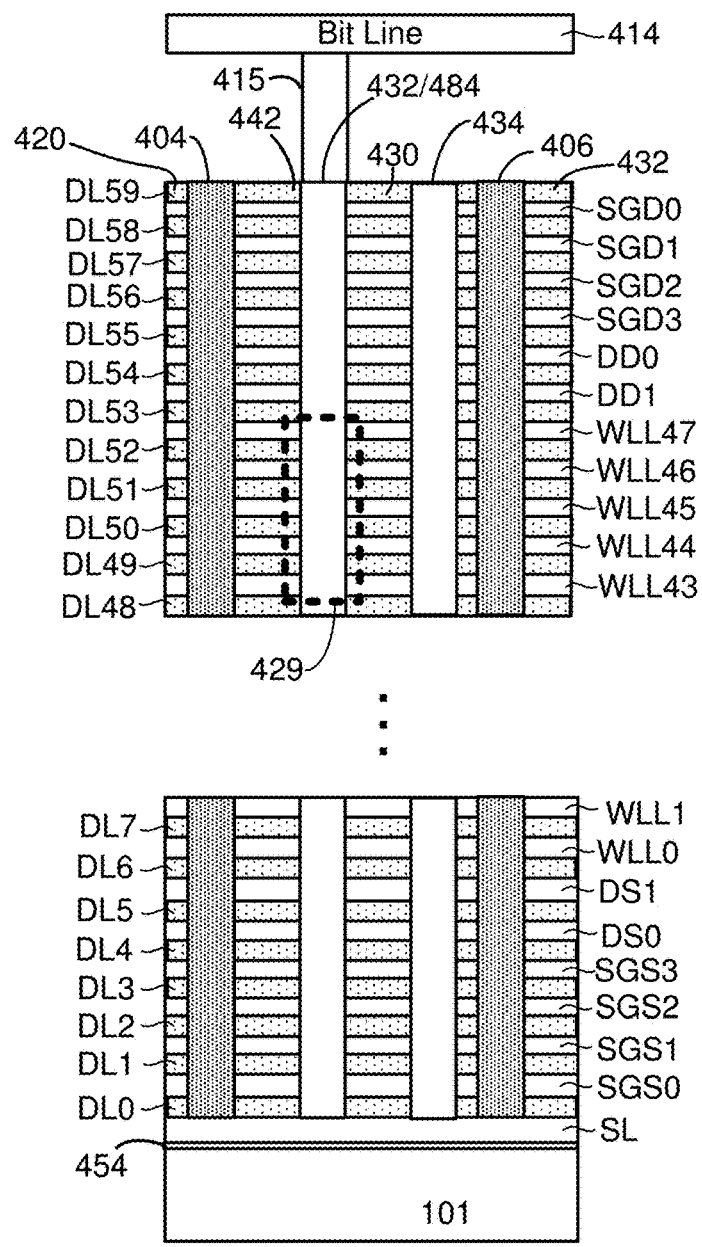
FIG. 4C depicts a cross sectional view of a portion of a block of memory cells.

FIG. 4C depicts a portion of an embodiment of three dimensional memory structure 126 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; four dummy word line layers DD0, DD1, DS0 and DS1; and forty eight data word line layers WLL0-WLL47 for connecting to data memory cells. Other embodiments can implement more or less than four drain side select layers, more or less than four source side select layers, more or less than four dummy word line layers, and more or less than forty eight word line layers (e.g., 96 word line layers). Vertical columns 432 and 434 are depicted protruding through the drain side select layers, source side select layers, dummy word line layers and word line layers. In one embodiment, each vertical column comprises a NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 415. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0 and DS1; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL59. For example, dielectric layers DL49 is above word line layer WLL43 and below word line layer WLL44. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DD0, DD1, DS0 and DS1 connect to dummy memory cells. A dummy memory cell does not store user data, while a data memory cell is eligible to store user data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4D depicts a logical representation of the conductive layers (SGD0, SGD1, SGD2, SGD3, SGS0, SGS1, SGS2, SGS3, DD0, DD1, DS0, DS1, and WLL0-WLL47) for the block that is partially depicted in FIG. 4C. As mentioned above with respect to FIG. 4B, in one embodiment local interconnects 402, 404, 406, 408 and 410 break up each conductive layers into four regions or fingers. For example, word line layer WLL31 is divided into regions 460, 462, 464 and 466. For word line layers (WLL0-WLL31), the regions are referred to as word line fingers; for example, word line layer WLL46 is divided into word line fingers 460, 462, 464 and 466. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

Figure 4E:
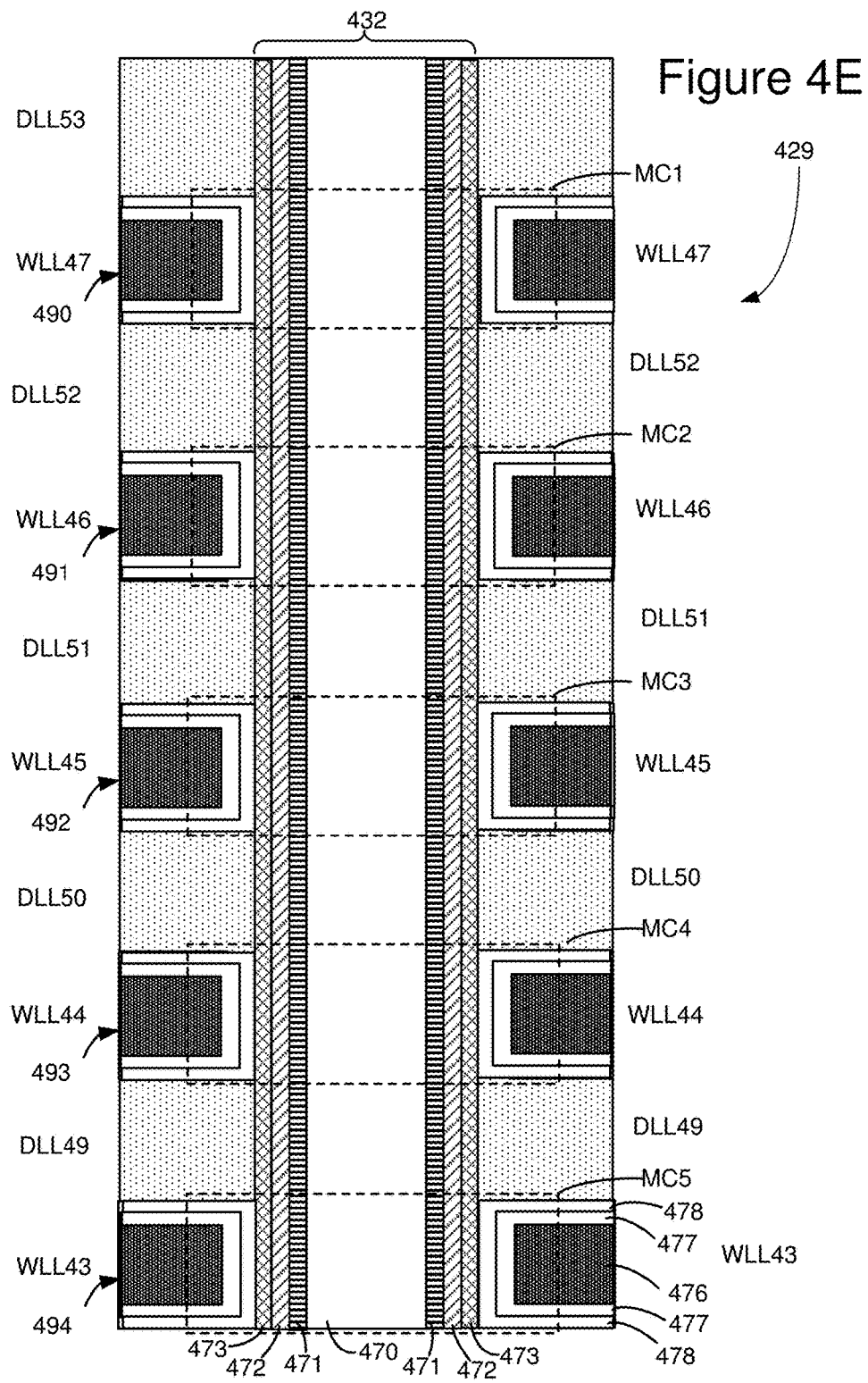
FIG. 4E is a cross sectional view of a vertical column of memory cells.

FIG. 4E depicts a cross sectional view of region 429 of FIG. 4C that includes a portion of vertical column 432. In one embodiment, the vertical columns are round and include four layers; however, in other embodiments more or less than four layers can be included and other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide ($SiO_2$) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 4F:
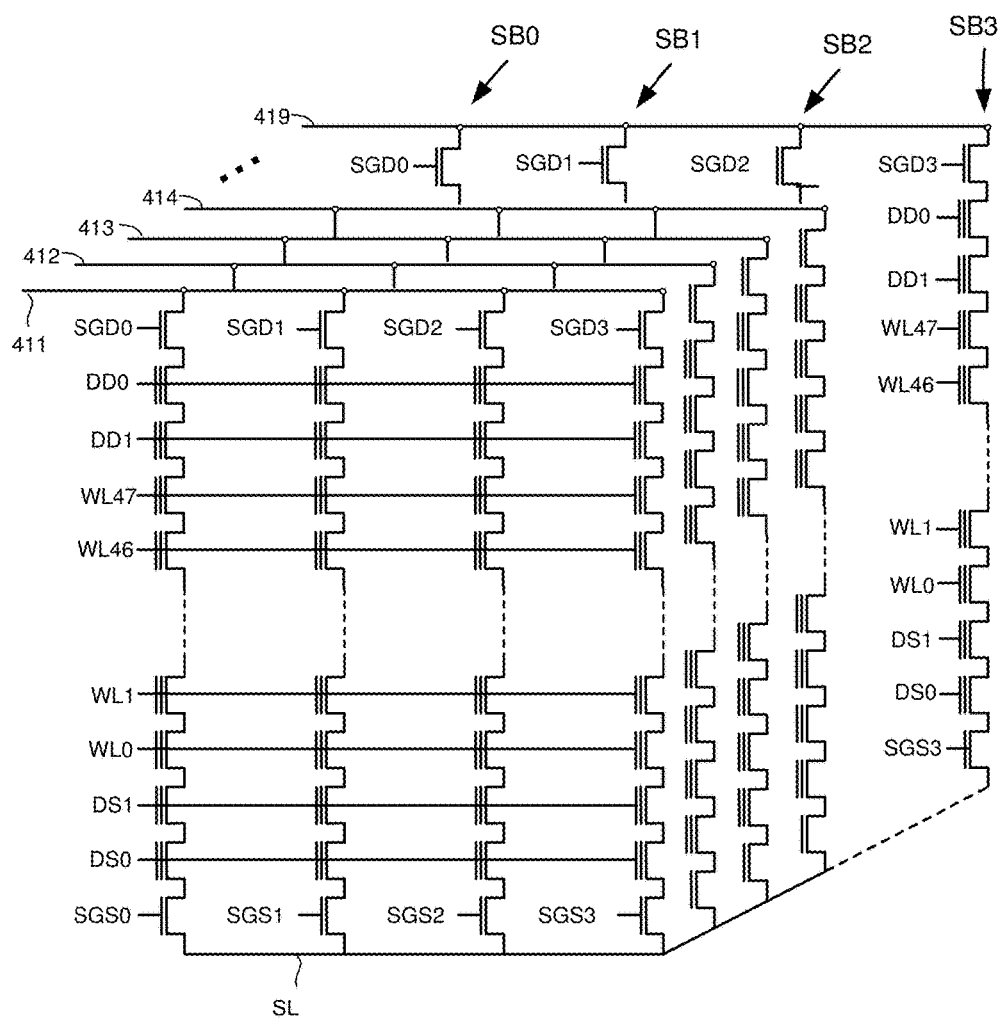
FIG. 4F is a schematic of a plurality of NAND strings.

FIG. 4F shows physical word lines WLL0-WLL47 running across the entire block. The structure of FIG. 4G corresponds to portion 306 in Block 2 of FIGS. 4A-F, including bit lines 411, 412, 413, 414, . . . 419. Within the block, each bit line connected to four NAND strings. Drain side select lines SGD0, SGD1, SGD2 and SGD3 are used to determine which of the four NAND strings connect to the associated bit line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Although the example memory system of FIGS. 4-4F is a three dimensional memory structure that includes vertical NAND strings with charge-trapping material, other (2D and 3D) memory structures can also be used with the technology described herein. For example, floating gate memories (e.g., NAND-type and NOR-type flash memory ReRAM memories, magnetoresistive memory (e.g., MRAM), and phase change memory (e.g., PCRAM) can also be used.

One example of a ReRAM memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCRAM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

Figures 5, 5A:
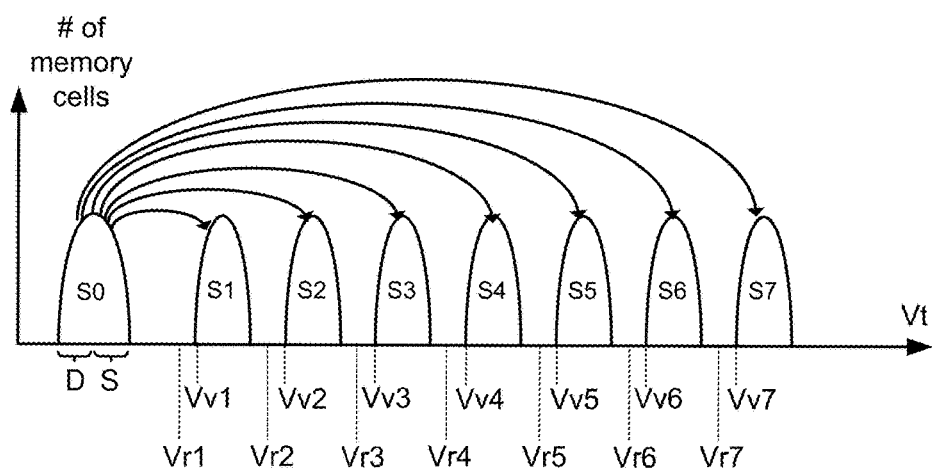
FIG. 5 depicts threshold voltage distributions.
FIG. 5A is a table describing one example of an assignment of data values to data states.

At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for the memory cell array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. The first threshold voltage distribution (data state) S0 represents memory cells that are erased. The other seven threshold voltage distributions (data states) S1-S17 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 5 also shows seven read reference voltages, Vr1, Vr2, Vr3, Vr4, Vr5, Vr6, and Vr7, for reading data from memory cells. By testing whether the threshold voltage of a given memory cell is above or below the seven read reference voltages, the system can determine what data state (i.e., S0, S1, S2, S3, . . . ) the memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv4. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent the full sequence programming. The technology described herein can also be used with other types of programming in addition to full sequence programming (including, but not limited to, multiple stage/phase programming). In some embodiments, data states S1-D7 can overlap, with Controller 122 relying on ECC to identify the correct data being stored.

FIG. 5A is a table describing one example of an assignment of data values to data states. In the table of FIG. 5A, S0-111. S1=110, S2=200, S3=000, S4=010, S5=011, S6=001 and S7=101. Other encodings of data can also be used. No particular data encoding is required by the technology disclosed herein.

Figure 6A:
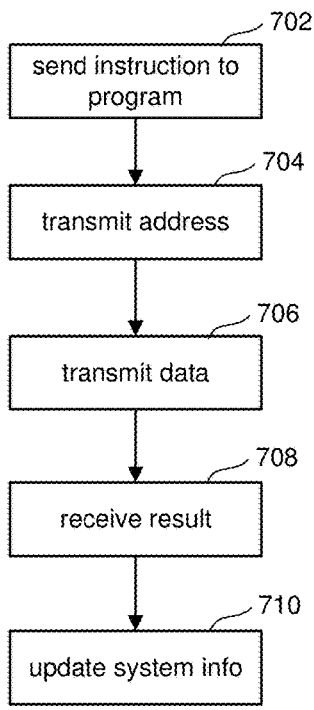
FIG. 6A is a flow chart describing one embodiment of a process for programming.

FIG. 6A is a flowchart describing one embodiment of a process for programming that is performed by Controller 122. In some embodiments, rather than have a dedicated Controller, the host can perform the functions of the Controller. In step 702, Controller 122 sends instructions to one or more memory die 108 to program data. In step 704, Controller 122 sends one or more logical addresses to one or more memory die 108. The one or more logical addresses indicate where to program the data. In step 706, Controller 122 sends the data to be programmed to the one or more memory die 108. In step 708, Controller 122 receives a result of the programming from the one or more memory die 108. Example results include that the data was programmed successfully, an indication that the programming operation failed, and indication that the data was programmed but at a different location, or other result. In step 710, in response to the result received in step 708, Controller 122 updates the system information that it maintains. In one embodiment, the system maintains tables of data that indicate status information for each block. This information may include a mapping of logical addresses to physical addresses, which blocks/word lines are open/closed (or partially opened/closed), which blocks/word lines are bad, etc.

In some embodiments, before step 702, Controller 122 would receive user data and an instruction to program from the host, and the Controller would run the ECC engine to create code words from the user data. These code words are the data transmitted in step 706. Controller can also scramble the data to achieve wear leveling with respect to the memory cells.

Figure 6B:
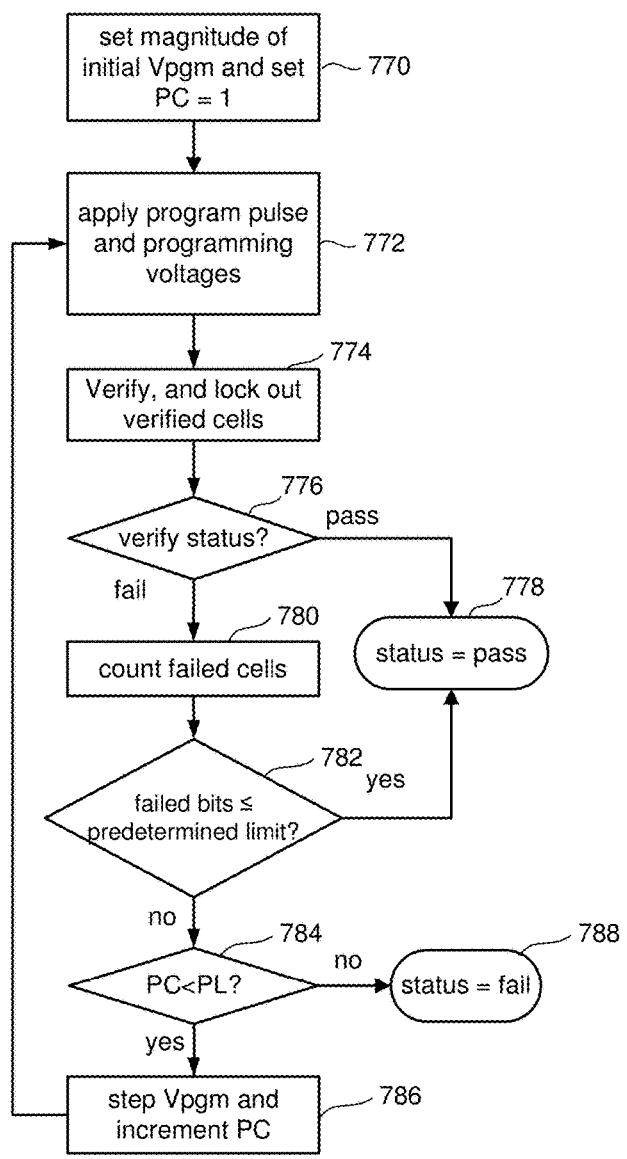
FIG. 6B is a flow chart describing one embodiment of a process for programming.

FIG. 6B is a flowchart describing one embodiment of a process for programming. The process of FIG. 6B is performed by the memory die in response to the steps of FIG. 6A (ie in response to the instructions, data and addresses from Controller 122). In one example embodiment, the process of FIG. 6B is performed on memory die 108 using the one or more control circuits discussed above, at the direction of state machine 112. The process of FIG. 6B can also be used to implement the full sequence programming discussed above. Additionally, the process of can be used to implement each phase of a multi-phase programming process.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size. In step 770 of FIG. 6B, the programming voltage (Vpgm) is initialized to the starting magnitude (e.g., ~12-16V or another suitable level) and a program counter PC maintained by state machine 112 is initialized at 1. In step 772, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming. In step 772, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 774, the appropriate memory cells are verified using the appropriate set of verify reference voltages to perform one or more verify operations. In one embodiment, the verification process is performed by applying the testing whether the threshold voltages of the memory cells selected for programming have reached the appropriate verify reference voltage.

In step 776, it is determined whether all the memory cells have reached their target threshold voltages (pass). If so, the programming process is complete and successful because all selected memory cells were programmed and verified to their target states. A status of "PASS" is reported in step 778. If, in 776, it is determined that not all of the memory cells have reached their target threshold voltages (fail), then the programming process continues to step 780.

In step 780, the system counts the number of memory cells that have not yet reached their respective target threshold voltage distribution. That is, the system counts the number of memory cells that have, so far, failed the verify process. This counting can be done by the state machine, the Controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 782, it is determined whether the count from step 780 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 778. In this situation, enough memory cells programmed correctly such that the few remaining memory cells that have not been completely programmed can be corrected using ECC during the read process. In some embodiments, step 780 will count the number of failed cells for each sector, each target data state or other unit, and those counts will individually or collectively be compared to a threshold in step 782.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 784 and the program counter PC is checked against the program limit value (PL). Examples of program limit values include 20 and 30; however, other values can be used. If the program counter PC is not less than the program limit value PL, then the program process is considered to have failed and a status of FAIL is reported in step 788. If the program counter PC is less than the program limit value PL, then the process continues at step 786 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 786, the process loops back to step 772 and another program pulse is applied to the selected word line so that another iteration (steps 772-786) of the programming process of FIG. 6B is performed.

In one embodiment, data is programmed in units of pages. So, for example, the process of FIG. 6B is used to program one page of data. Because it is possible that errors can occur when programming or reading, and errors can occur while storing data (e.g., due to electrons drifting, data retention issues or other phenomenon), error correction is used with the programming of a page of data. Many ECC coding schemes are well known in the art.

Step 774 of FIG. 6B includes performing verification. The process of verifying includes performing various sensing operations that include applying a verify compare voltage (e.g., Vv1, Vv2, Vv3, . . . ) on the selected word line to determine whether selected memory cells have a threshold voltage less than or greater than the verify compare voltage. Because the selected word line can be connected to selected memory cells and unselected memory cells, it is possible that the application of the verify compare voltage can cause unselected memory cells connected to the selected word line (thereby receiving the verify compare voltage) to a change in threshold voltage. This is called read disturb. To prevent read disturb during the verify operations, the memory system boosts the channels of unselected NAND strings by applying a boosting voltage (referred to as Vread) to unselected word lines. As a result, the channels of unselected NAND strings boost up to a positive voltage, which reduces the voltage differential between the channel and the control gates, thereby reducing the change of a read disturb.

In BiCS (Bit-Cost Scalable) flash memory structures (and other memory structures), one block consists of multiple sub-blocks. All the sub-blocks share same word lines, bit lines and source line biases, but have separate select line (SGS and SGD) biases. Different from the conventional 2D NAND memory cell structure, BiCS memory cell has a thin poly Si channel thickness (usually <20 nm), and floating body (no substrate). These two features enable excellent gate control, meaning excellent capacitive coupling between gate and Si channel. However, during signal transient periods, if voltage signals between two adjacent word lines need switching between different voltage levels, it is possible that in the transient period of time, the channel potential gradient between two neighbor word lines is large enough to create electron/hole generation and hence hot electron injection into the charge trapping region, resulting in a hot electron injection type of disturb. During program verify operations (Step 774 of FIG. 6B) when the boosting voltage Vread starts to ramp up, severe hot electron injection disturb could happen in unselected NAND string for word lines adjacent to the selected word line under program verify operation. Thus, the memory is experiencing a hot electron injection disturb due to the means for reducing read disturb (e.g., the boosting as a result of Vread).

One approach to addressing such hot electron injection includes turning on SGD/SGS in the unselected NAND strings when Vread ramps up to interrupt the boosting, as taught in U.S. Pat. No. 9,171,632. However, this approach requires additional timing allocation for all word lines and all program pulses, and hence degrades program performance. To address the degradation of performance, it is proposed to implement a customized timing treatment for the interruption of the boosting based on memory cell and/or word line position.

FIG. 7 is a flow chart of one embodiment of a process for verifying programming. The process of FIG. 7 is one example implementation of step 774 of FIG. 6B, which is performed after applying programming (e.g. step 772). In one embodiment, the process of FIG. 7 is performed by the one or more control circuits (e.g., at the direction of state machine 112 or controller 122).

In step 800, the one or more control circuits apply a voltage to select gates for selected sub-block to turn on the select gates. For example, looking back at FIG. 4F, step 800 can include applying a positive gate voltage for any or SGDS0, SGD1, SGD2, SGD3, SGS0, SGS1, SGS2 or SGS3. If sub-block SB0 is selected, then step 800 includes applying the signal to SGD0 and/or SGS0 to turn on the select gates so the NAND strings in SB0 are in communication with the appropriate bit line and/or the source line. In step 802, the one or more control circuits apply a voltage to select gates for unselected sub-blocks to turn off the select gates and allow boosting. For example, if sub-block SB0 is selected, then step 802 includes applying the appropriate signal to at least SGD1, SGD2, SGD3, SGS1, SGS2 and SGS3 to turn on the select gates so the NAND strings in SB1, SB2 and SB3 are not in communication with the appropriate bit line and the source line. In step 804, the one or more control circuits apply and increase one or more boosting voltages to unselected word lines to boost channels of unselected NAND strings to prevent read disturb. For example, unselected word lines will receive a voltage between 7 and 10 volts, referred to a Vread, that will cause the memory cells connected to the unselected word lines to turn on and act as pass gates. This way, the current through a NAND string will be representative of the current through the selected memory cell on that NAND string. By applying the boosting voltage to unselected word lines, those NAND strings (ie unselected NAND strings) whose select gates are turned off will have their channel voltage boosted. This boosting of the channel voltage reduces the voltage differential between the channel and the selected word line and, therefore, reduces read disturb.

In step 806, while increasing the boosting voltages of step 804, the one or more control circuits temporarily change the voltage applied to the select gates in step 802 for unselected NAND strings to temporarily turn on the select gates for unselected NAND strings in order to temporarily prevent/ stop boosting of the channels of the unselected NAND strings for a duration of time based on position of the selected word line. This will have the effect of reducing the boosting of the channel More detail of step 806 is described below. In step 808, the one or more control circuits apply a data state dependent verify compare voltage (e.g., Vv1, Vv2, Vv3, Vv4, Vv5, Vv6, Vv7 of FIG. 5) to the selected word line (which is connected to the memory cells selected for programming). In step 810, the one or more control circuits sense threshold voltage information of selected memory cells in the selected NAND strings in response to the verify compare voltage. For example, if the system is trying to verify programming to data state S5, then step 808 includes applying Vv5 to the selected word line and step 810 includes sensing whether the threshold voltage of the selected memory cells (which are connected to the selected word line) is above or below Vv5. For example, if a NAND string turns on and conducts current, then the threshold voltage of the selected memory cell is below Vv5.

In one embodiment, after each programming pulse (step 772), the system verifies programming to multiple data states. Therefore, steps 800-810 need to be repeated for each data state being verified. If there are more data states that need to be verified (step 812), then the process will loop back to step 800; otherwise, the process of FIG. 7 will continue at step 814 and the results of the verification will be saved and reported. At this point, this instance of the verification process is complete. However, in one embodiment, the process of FIG. 7 is performed after each programming pulse.

FIGS. 8A-F are timing diagrams depicting example behavior of various signals during a verify operation. FIGS. 8A-F provide one example implementation of steps 800-810 of FIG. 7. FIGS. 8A-F depict the signals Vsgd_unsel, Vsgs_unsel, Vsgd_sel, Vsgs_sel, WL unsel, WL_sel, Vbl, Vchannel_sel, and Vchannel_unsel.

The signal Vsgd_unsel is the voltage applied to the unselected drain side select lines. For example, if SB0 is selected, then Vsgd_unsel is applied to SGD1, SGD2 and SGD3. The signal Vsgs_unsel is the voltage applied to the unselected source side select lines. For example, if SB0 is selected, then Vsgd_unsel is applied to SGS1, SGS2 and SGS3. In one embodiment, Vsgs_unsel=Vsgd_unsel. The signal Vsgd_sel is the voltage applied to the selected drain side select lines. For example, if SB0 is selected, then Vsgd_sel is applied to SGD0. The signal Vsgs_sel is the voltage applied to the selected source side select lines. For example, if SB0 is selected, then Vsgd_sel is applied to SGS0. In one embodiment, Vsgs_sel=Vsgd_sel. The signal WL_unsel is the voltage applied to the unselected word lines. The signal WL_sel is the voltage applied to the selected word lines. For example, if WL47 is selected then WL_unsel is applied to WL0-WL46 and WL_sel is applied to WL47. The signal Vbl is the bit line voltage. The signal Vchannel_sel is the voltage in the channel of NAND strings selected to be verified. In one embodiment, Vbl=Vchannel_sel. The signal Vchannel_unsel is the voltage in the channel of NAND strings not selected to be verified.

Figure 8A:
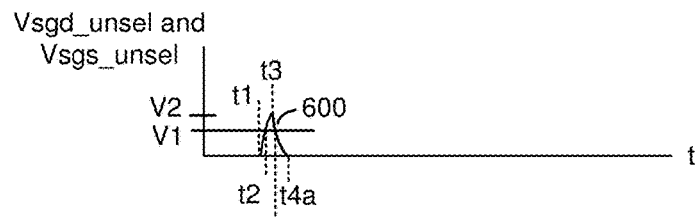
FIGS. 8A-F are timing diagrams depicting example behavior of various signals during a verify operation.

FIG. 8A depicts a spike shaped voltage (voltage spike) is applied to both the SGD and SGS select gates for unselected NAND strings. A spike shaped voltage waveform can be a voltage waveform that is increased toward a commanded level and abruptly decreased. In one approach, the voltage waveform is decreased before it reaches the commanded level. In one approach, the voltage waveform is decreased after it reaches the commanded level. A spike shaped voltage waveform can be characterized by its peak amplitude and its duration or width. The voltage can also be described as an increase in voltage/signal followed by a decrease in voltage/signal or a sharp increase in magnitude followed by a sharp decrease in magnitude.

FIG. 8A shows Vsgs_unsel and Vsgd_unsel transition or spike up from 0 V starting at t1, exceed a level of V1 at t2, reach a peak of V2 at t3, fall below V1 at t4 and subsequently back to 0 V at t4a. Specifically, from t1-t3, the one or more control circuits requests Vsgd_unsel and Vsgs_unsel to be at a specified level. Due to finite response times and RC delays, the actual level of Vsgd_unsel and Vsgs_unsel will transition up over a period of time from t1-t3. In one approach, the period t1-t3 is not sufficient for Vsgd_unsel and Vsgs_unsel to reach the requested level. Instead, Vsgd_unsel and Vsgs_unsel peak at t3 at some level referred to as V2. From t2-t4, Vsgd_unsel and Vsgs_unsel are sufficiently high, e.g., above V1, so that the SGD and SGS select gates transition to a conductive state. V1 is based on factors including the Vth of the SGD and SGS select gates. The SGD and SGS select gates are in a non-conductive state before t2 and after t4, which corresponds to step 802. At t3, the control circuit requests Vsgd_unsel and Vsgs_unsel to be set, e.g., to 0 V, in response to which Vsgd_unsel and Vsgs_unsel decay toward 0 V.

Figure 8B:
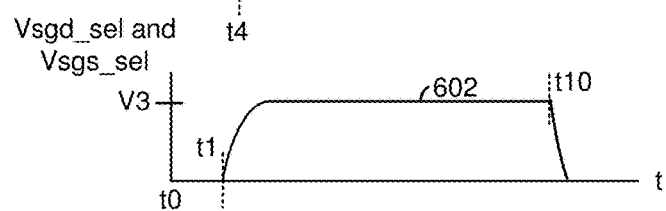

FIG. 8B, shows Vsgd_sel and Vsgs_sel transitioning from 0 V at t0 to a level referred to as V3 (V3>V2) at t1, remain at V3, a steady state level, for a duration of the verify/read operation, and transition back to 0 V at t10. Vsgd_sel and Vsgs_sel will enter a conductive state shortly after t1, which corresponds to step 800.

Figure 8C:
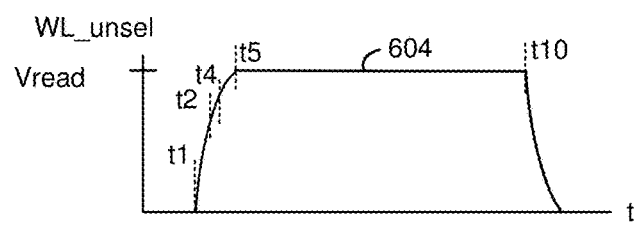

FIG. 8C, which corresponds to step 804, depicts WL_unsel transition from 0 V at t1 to a steady state level of Vread at t5, in one continuous increase, remain at Vread from t5-t10, and transitions back to 0 V at t10. Vread is sufficiently high to provide all unselected memory cells in a conductive state. As a result of applying Vread to the unselected word lines, the channel of unselected NAND strings is boosted, as described below with respect to FIG. 8F.

Figure 8D:
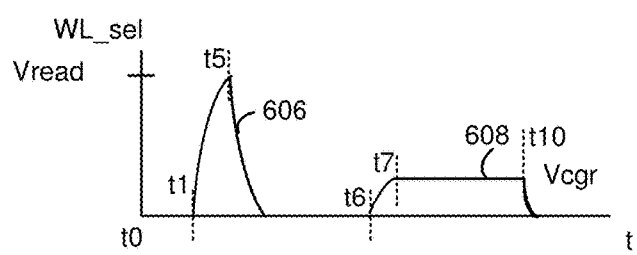

FIG. 8D, which corresponds to step 808, shows WL_sel transitioning from 0 V to Vread and back to 0 V, in a boosting phase of a verify or sensing read operation, and then to Vcgr and back to 0 V, in a sensing phase of a verify or read operation. For example, FIG. 8D shows WL-sel transitioning up from 0 V at t1, reaching Vread at t5, and transitioning back to 0 V after t5. Raising WL_sel above the Vth of the selected memory cells causes the selected memory cells to be in a conductive state. At t6, WL_sel transitions from 0 V to Vcgr and remains at that level until t10. Vcge can be one of the verify compare voltages (e.g., Vv1, Vv2, Vv3, Vv4, Vv5, Vv6, Vv7) or one of the read compare voltages (e.g., Vr1, Vr2, Vr3, Vr4, Vr5, Vr6, Vr7).

Figure 8E:
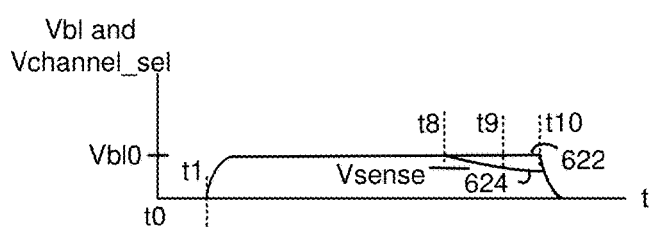

FIG. 8E shows the bit line voltage Vb1 transitioning from 0 V to Vb10 (an elevated non-zero level which is suitable for sensing) at t1, and either remains at Vb10 or decays during sensing (step 810) from t8-t10, and transitions back to 0 V at t10. In one example approach, the voltage in the channel of the selected NAND string, Vchannel_sel, will be set to Vb1, when Vsgd_sel and Vsg_sel are conductive. Time t9 is a sense time (Tsense) at which sensing circuitry associated with each select NAND string determines a conductive state of the NAND string (step 810). Since WL_unsel causes the unselected memory cells in a NAND string to be in a conductive state, the conductive state of the NAND string as determined by sensing indicates the conductive state of the selected memory cell. With Vcgr applied to the selected memory cell, the conductive state of the NAND string indicates whether the Vth of the selected memory cell exceeds Vcgr. In one approach, Vb1 decays below a level Vsense at t9 when the string is conductive, as represented by waveform 624 and this decay is sensed by the sensing circuitry. Waveform 622 represents the case where the string is not conductive, in which case Vb1 does not decay below Vsense.

In FIG. 8A, from t1-t2, the SGD and SGS select gates of the unselected NAND strings are in a non-conductive state, as mentioned, so that the channel is isolated. As a result, when WL_unsel is ramped up, Vchannel_unsel, the channel voltage of an unselected NAND string, (waveforms 626 and 628) increases due to capacitive coupling. From t2-t4, the SGD and SGS select gates for the unselected NAND strings are in a conductive state due to the spike shaped voltage is applied to both the SGD and SGS select gates for unselected NAND strings (see FIG. 8A). As a result, the drain end of the channel will communicate with the bit line which is at a level, e.g., between 0 V and Vb10, and the source end of the channel will communicate with the source line which is at, e.g., 0 V. Vchannel_unsel provides a representative overall voltage of the channel Its exact level may be difficult to predict, but it will be governed by the driving voltages at the opposing ends. As an example, in FIG. 8F, Vchannel 628 increases from t1-t2 at a relatively high rate due to the relatively high rate of WL_unsel from t1-t2. The increase in Vchannel_unsel is interrupted from t2-t4 because the channel is no longer isolated due to the SGD and SGS select gates becoming conductive as per the voltage spiked depicted in FIG. 8A. After t4, the channel is isolated again due to the SGD and SGS select gates becoming non-conductive. Vchannel increases again from t4-t5 but at a relatively low rate due to the relatively low rate of WL_unsel from t4-t5. By making the SGD and SGS select gates of an unselected NAND string temporarily and briefly conductive during the increase of WL_unsel, capacitive coupling from WL_unsel and WL_sel is temporarily interrupted. After t4, the SGD and SGS select gates are in a non-conductive state. As WL_unsel continues to ramp up from t4-t5, Vchannel (waveform 628) increases due to capacitive coupling from WL_unsel, reaching a level referred to as Vch0. When WL_unsel is steady at Vread from t5-t10, Vchannel (waveform 628) does not increase since there is no capacitive coupling from the steady voltage.

Figure 8F:
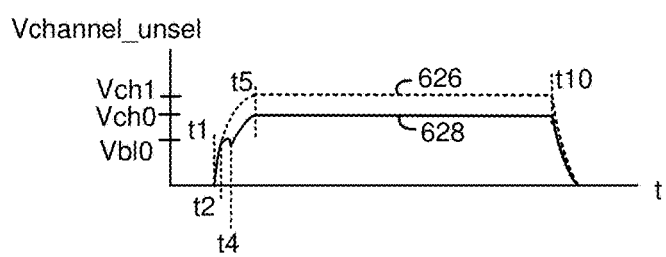

Waveform 626 in FIG. 8F represents a comparison case for Vchannel in which no spiking of the SGD or SGS select gates is used, so that the full measure of channel boosting (at a level referred to as Vch1) is realized. By reducing the channel boosting to the optimum level referred to as Vch0 (Vb10<Vch0<Vch1), the read disturb is still addresses; however, the hot electron injection disturb due to the means for reducing read disturb is reduced.

An unselected memory cell (in an unselected sub-block) which is connected to the same word line or word line portion (e.g., is at the same level) as a selected memory cell in a selected sub-block, will transition to a conductive state since Vread or a similar level exceeds the Vth of the highest state memory cell. As a result, the channel of the unselected NAND string is not cutoff at the unselected memory cell which is connected to the same word line or word line portion as a selected memory cell, and the temporary conductive state of the SGD select gate, for instance, can achieve the desired goal of allowing the channel to communicate with the bit line. The channel of the unselected NAND string similarly is not cutoff at the other unselected memory cells (which are not connected to the same word line or word line portion as a selected memory cell, and which are connected to the same word line or word line portion as an unselected memory cell in a selected NAND string).

Although the application of the voltage spike on the unselected select lines depicted in FIG. 8A reduces hot electron injection disturb, it also adds time to the sensing process which negatively impacts performance of verification and reading processes. Slowing down verification slows down programming. It has been found that the hot electron injection disturb discussed above has different severities for memory cells on different word lines. For a memory system that programs memory cells connected to a common word line at the same time and programs (on a word line basis) from the source side to the drain side, memory cells on word lines closest to the source side (e.g., WL0, WL1, WL2, . . . ) experience the most severe hot electron injection disturb during verification and word lines closest to the drain side (e.g., WL47, WL46, WL45, . . . ) experience the lest severe hot electron injection disturb during verification. Therefore, to balance performance versus severity of hot electron injection disturb, it is proposed to adjust the duration or width of the voltage spike on the unselected select lines depicted in FIG. 8A based on position of the word line being verified or read (step 806). Basing the duration or width of the voltage spike on position of the word line is also, in effect, basing the duration or width of the voltage spike on position of the memory cell within the block. In one embodiment, the duration or width of the voltage spike is measured from t1 to t4a, representing the start and end of the voltage spike. In another embodiment, the duration or width of the voltage spike is measured from t2 to t4, representing when the spike has a magnitude sufficient to turn on the select gates. In another embodiment, the duration or width of the voltage spike is measured from t2 to t3, t1 to t3, or t1 to t4. Other measurements can also be used.

In one embodiment, each word line in a block will be associated with a separate of different duration of time for applying the voltage spike on the unselected select lines as depicted in FIG. 8A. In other embodiments, the word lines are divided into sets or zones of word lines, where each set or zone is associated with a duration of the voltage spike.

Figure 9:
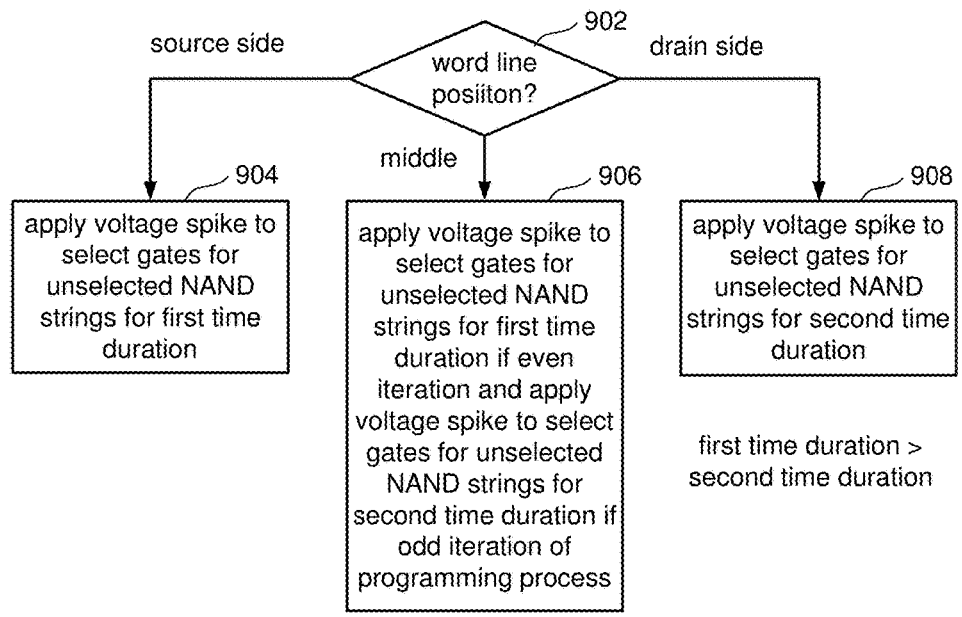
FIG. 9 is a flow chart describing one embodiment of a process for preventing/mitigating boosting.

FIG. 9 is a flow chart describing one embodiment of a process for preventing/mitigating boosting. That is, the process depicted in FIG. 9 is one example implementation of step 806 of FIG. 7. The process of FIG. 9 is performed by the one or more control circuits. In one embodiment, the process of FIG. 9 includes applying the voltage spike on the unselected select lines depicted in FIG. 8A for a duration based on the position of the selected word line.

In step 902 of FIG. 9, the one or more control circuits determine the position of the word line selected for verification. In this embodiment, the word lines are broken into three zones: (1) a source side zone closest to the source line (e.g., WL0-WL15), (2) a drain side zone closes to the drain side and the bit line (e.g., WL32-WL47), and (3) a middle zone that is between the other two zones (e.g., WL16-WL31). If the word line selected for verification is in the source side zone, then in step 904 the voltage spike is applied to the unselected select lines as depicted in FIG. 8A for a first time duration. If the word line selected for verification is in the drain side zone, then in step 908 the voltage spike is applied to the unselected select lines as depicted in FIG. 8A for a second time duration. In one embodiment, the first duration is longer than the second duration. Examples include the first time duration at 2.64 us and the second time duration at 1.36 us. If the word line selected for verification is in the middle zone, then in step 906 the one or more control circuits apply the voltage spike to select gates for unselected select lines (and, thus, the unselected NAND strings) for the first time duration if currently performing an even iteration of the programming process and apply the voltage spike to select gates for unselected select lines (and, thus, the unselected NAND strings) for the second time duration if currently performing an odd iteration of the programming process. Looking back at FIG. 6B, the programming process includes a loop comprising steps 772-786. Each performance of that loop is an iteration of the programming process. Thus, if the word line selected for verification is in the middle zone, half of the iterations of the programming process use the first time duration for the voltage spike and half of the iterations of the programming process use the second time duration for the voltage spike. Other embodiments, can change the mix from 50-50 to other combinations of the two or more time durations. In other implementation, more than two time durations can be used and more than three zones can be used. In some embodiments, the middle zone has its own time duration.

FIGS. 7, 8A-F and 9 described processes for verifying programming that include reducing read disturb of unselected memory cells during the verifying and reducing hot electron injection disturb due to the reducing read disturb, where the reducing hot electron injection disturb performs disturb mitigation based on selected word line position. Note that in some embodiments, rather than NAND strings, other types of groups of connected memory cells can be used.

As discussed above, during signal transient periods, if voltage signals between two adjacent word lines need switching between different voltage levels, it is possible that in the transient period of time, the channel potential gradient between two neighbor word lines is large enough to create electron/hole generation and hence hot electron injection into the charge trapping region, resulting in a hot electron injection type of disturb. During read operations (when the boosting voltage Vread starts to ramp up, severe hot electron injection disturb could happen in unselected NAND string for word lines adjacent to the selected word line. Thus, the memory is experiencing a hot electron injection disturb due to the means for reducing read disturb (e.g., the boosting as a result of Vread).

One approach to addressing such hot electron injection includes turning on SGD/SGS in the unselected NAND strings when Vread ramps up to interrupt the boosting. However, as mentioned above, this approach requires additional timing allocation for all word lines and all program pulses, and hence degrades program performance. To address the degradation of performance, it is proposed to implement a customized timing treatment during a read process for the interruption of the boosting based on memory cell and/or word line position.

FIG. 10 is a flow chart of one embodiment of a process for reading data from memory cells. In one embodiment, the process of FIG. 10 is performed by the one or more control circuits (e.g., at the direction of state machine 112 or controller 122). The process for reading data comprises sensing at the various read compare voltages (e.g., Vr1, Vr2, Vr3, Vr4, Vr5, Vr6, Vr7), recording which memory cells turn on in response to which compare voltages and deducing the stored data state accordingly. FIGS. 8A-F, described above, can also be used to provide one example implementation of steps 950-960 of FIG. 10.

In step 950 of FIG. 10, the one or more control circuits apply a voltage to select gates for selected sub-block to turn on the select gates. For example, looking back at FIG. 4F, step 950 can include applying a positive gate voltage for any or SGDS0, SGD1, SGD2, SGD3, SGS0, SGS1, SGS2 or SGS3. If sub-block SB0 is selected, then step 950 includes applying the signal to SGD0 and/or SGS0 to turn on the select gates so the NAND strings in SB0 are in communication with the appropriate bit line and/or the source line. FIG. 8B depicts an example implementation of step 950. In step 952, the one or more control circuits apply a voltage to select gates for unselected sub-blocks to turn off the select gates and allow boosting. For example, if sub-block SB0 is selected, then step 952 includes applying the appropriate signal to at least SGD1, SGD2, SGD3, SGS1, SGS2 and SGS3 to turn on the select gates so the NAND strings in SB1, SB2 and SB3 are not in communication with the appropriate bit line and the source line. The zero volts applied to the unselected select lines prior to time t1 and after time t4a in FIG. 8A provides an example implementation of step 952.

In step 954, the one or more control circuits apply and increase one or more boosting voltages to unselected word lines to boost channels of unselected NAND strings to prevent read disturb. For example, unselected word lines will receive a voltage between 7 and 10 volts, referred to a Vread, that will cause the memory cells connected to the unselected word lines to turn on and act as pass gates. This way, the current through a NAND string will be representative of the current through the selected memory cell on that NAND string. By applying the boosting voltage to unselected word lines, those NAND strings (ie unselected NAND strings) whose select gates are turned off will have their channel voltage boosted. This boosting of the channel voltage reduces the voltage differential between the channel and the selected word line and, therefore, reduces read disturb. FIG. 8C depicts an example implementation of step 954.

In step 956, while increasing the boosting voltages of step 954, the one or more control circuits temporarily change the voltage applied to the select gates in step 952 for unselected NAND strings to temporarily turn on the select gates for unselected NAND strings in order to temporarily prevent/stop (or otherwise interrupt) boosting of the channels of the unselected NAND strings for a duration of time based on position of the selected word line. This will have the effect of reducing the boosting of the channel. The voltage spike between time t1 and time t4a in FIG. 8A provides an example implementation of step 956, with the duration of the voltage spike being adjusted by the one or more control circuits based on position of the selected memory cell and/or selected word line. In step 958, the one or more control circuits apply a data state dependent read compare voltage (e.g., Vr1, Vr2, Vr3, Vr4, Vr5, Vr6, Vr7 of FIG. 5) to the selected word line (which is connected to the memory cells selected for programming) FIG. 8D depicts an example implementation of step 958. In step 960, the one or more control circuits sense threshold voltage information of selected memory cells in the selected NAND strings in response to the read compare voltage. FIG. 8E depicts an example sensing od of step 960. The sensing of step 960 is performed after the mitigating of the boosting in step 956.

In one embodiment, a sense operation will be performed for each of the programmed data states (e.g., S1-S7). Therefore, steps 950-960 need to be repeated for each programmed data state. If there are more data states that need to be verified (step 962), then the process will loop back to step 950; otherwise, the process of FIG. 10 will continue at step 964 and the results of the read will be processed to determine which data state each of the read memory cells are in. That result is saved and reported.

It has been found that the hot electron injection disturb discussed above has different severities for memory cells on different word lines. Therefore, to balance performance versus severity of hot electron injection disturb, it is proposed to adjust the duration or width of the voltage spike on the unselected select lines depicted in FIG. 8A based on position of the word line being read (step 956). In one embodiment, each word line in a block will be associated with a separate of different duration of time for applying the voltage spike on the unselected select lines as depicted in FIG. 8A. In other embodiments, the word lines are divided into sets or zones of word lines, where each set or zone is associated with a duration of the voltage spike.

Memory cells on word lines closest to the source side (e.g., WL0, WL1, WL2, . . . ) or closest to the drain side (e.g., WL47, WL46, WL45, . . . ) experience the most severe hot electron injection disturb during reading, while word lines in the middle (e.g., . . . WL29, WL30, WL31, . . . ) experience a less severe hot electron injection disturb during reading. A word line at either end of the block (source side or drain side), can be thought of as an edge word line. In the example of FIG. 46, WL0 and WL47 are edge word lines. In other embodiments, the edge word lines can include 2 or more word lines at the far end of each side; for example, WL0, WL1, WL2, WL45, WL46 and WL7 can be thought of as edge word lines. In one example embodiment, edge word lines will be read with different duration for the voltage spike of FIG. 8A than middle word lines. In one embodiment, a block will have one or more end regions and a middle region, such that the end regions will be read with a first time duration for the voltage spike and the middle region will be read with a different time duration for the voltage spike.

Figure 11:
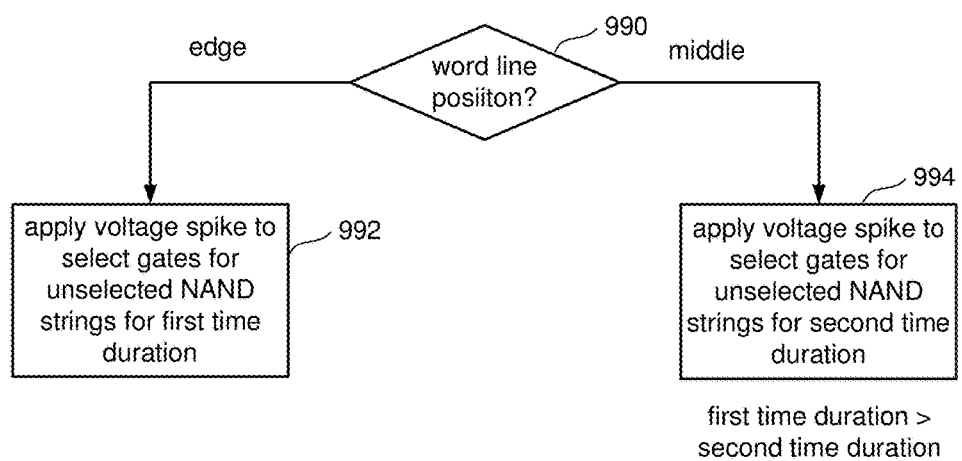
FIG. 11 is a flow chart describing one embodiment of a process for preventing/mitigating boosting.

FIG. 11 is a flow chart describing one embodiment of a process for preventing/mitigating boosting. That is, the process depicted in FIG. 1 is one example implementation of step 856 of FIG. 10. The process of FIG. 11 is performed by the one or more control circuits. In one embodiment, the process of FIG. 11 includes applying the voltage spike on the unselected select lines depicted in FIG. 8A for a duration based on the position of the selected word line and/or position of the selected memory cell. In step 990 of FIG. 11, the one or more control circuits determine the position of the word line selected for reading. In this embodiment, the word lines are broken into two groups: edge word lines and middle word lines. If the selected word line (the word line selected for reading, meaning that the memory cells connected to the selected word line will be read) is an edge word line, then in step 956 of FIG. 10 the one or more control circuits will apply a voltage spike (see FIG. 8A) to the unselected select lines having a duration equal to a first time duration. If the selected word line (the word line selected for reading, meaning that the memory cells connected to the selected word line will be read) is a middle word line, then in step 956 of FIG. 10 the one or more control circuits will apply a voltage spike (see FIG. 8A) to the unselected select lines having a duration equal to a second time duration. The first time duration (e.g., 2.64 us) is greater than the second time duration (e.g., 1.36 us). FIGS. 10, 11 and 8 describe sensing the non-volatile memory cells including reducing hot electron injection disturb based on selected word line position.

One embodiment includes a non-volatile storage apparatus, comprising: a plurality of non-volatile memory cells; and one or more control circuits in communication with the memory cells, the one or more control circuits configured to program the memory cells and verify the programming. To verify the programming the one or more control circuits are configured to apply one or more voltages to perform boosting of a channel region associated with an unselected memory cell, allow the boosting of the channel region for a portion of time while applying the one or more voltages, prevent the boosting of the channel region while applying the one or more voltages for a duration of time based on position of a memory cell selected for verification, apply a compare signal to the memory cell selected for verification and the unselected memory cell, and perform a sensing operation for the memory cell selected for verification in response to the compare signal.

One example implementation further includes word lines and select lines connected to the one or more select gates. The non-volatile memory cells are arranged in NAND strings that include one or more select gates. The word lines are connected to the non-volatile memory cells of the NAND strings. The one or more control circuits are configured to verify the programming by applying a voltage to one or more select lines for selected NAND strings to turn on one or more select gates for selected NAND strings, applying a voltage to one or more select lines for unselected NAND strings to turn off one or more select gates for unselected NAND strings, applying and increasing a boosting voltage to unselected word lines to boost channels of unselected NAND strings such that the unselected word lines are connected to the selected NAND strings and the unselected NAND strings, applying a compare voltage to a selected word line connected to the selected NAND string and the unselected NAND strings, sensing a threshold voltage of selected memory cells in the selected NAND strings in response to the compare voltage, and while increasing the pass voltage, temporarily changing the voltage applied to the select lines for unselected NAND strings to temporarily turn on the select gates for unselected NAND strings in order to prevent boosting of the channels of the unselected NAND strings for a duration of time based on position of the selected word line.

One embodiment includes a method of operating non-volatile storage, comprising: programming non-volatile memory cells; and verifying the programming. The verifying the programming comprises: applying a voltage to one or more select gates for selected groups of memory cells to turn on the one or more select gates for selected groups of memory cells, applying a voltage to one or more select gates for unselected groups of memory cells to turn off the one or more select gates for the unselected groups of memory cells, applying and increasing a boosting voltage to unselected control lines to boost channels of unselected groups of memory cells, the unselected control lines are connected to the selected groups of memory cells and the unselected groups of memory cells, applying a compare voltage to a selected control line connected to the selected groups of memory cells and the unselected groups of memory cells, sensing a threshold voltage of selected memory cells in the selected groups of memory cells in response to the compare voltage, and while increasing the boosting voltage, temporarily changing the voltage applied to the select gates for unselected groups of memory cells to temporarily turn on the select gates for unselected groups of memory cells in order to prevent boosting of the channels of the unselected groups of memory cells for a duration of time based on position of the selected control line.

One embodiment includes a non-volatile storage apparatus, comprising: a three dimensional memory structure including a plurality of non-volatile memory cells, word lines, select lines and bit lines; means for programming the non-volatile memory cells; and means for verifying programming including means for reducing read disturb of unselected memory cells during the verifying and means for reducing hot electron injection disturb due to the means for reducing read disturb, the means for reducing hot electron injection disturb performs disturb mitigation based on selected word line position.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
   a plurality of non-volatile memory cells organized into blocks; and
   one or more control circuits in communication with the memory cells, the one or more control circuits configured to program the memory cells and verify the programming;
   to verify the programming of a selected memory cell in a first block the one or more control circuits are configured to apply one or more voltages to perform boosting of a channel region associated with an unselected memory cell in the first block, allow the boosting of the channel region while applying the one or more voltages, apply a compare signal to the selected memory cell and the unselected memory cell, and perform a sensing operation for the selected memory cell in response to the compare signal;
   while applying the one or more voltages, the one or more control circuits are configured to temporarily prevent an increase in the boosting of the channel region for a first duration of time if the selected memory cell is within a first zone of the first block and for a second duration of time if the selected memory cell is within a second zone of the first block, the first duration is longer than the second duration, the second duration is greater than zero.

2. The non-volatile storage apparatus of claim 1, wherein:
   the non-volatile memory cells are arranged in groups of connected non-volatile memory cells;
   the memory cell selected for verification is in a selected group of connected non-volatile memory cells;
   the selected group of connected non-volatile memory cells has a first end and a second end;
   the one or more control circuits are configured to program memory cells in the selected group in an order from the first end to the second end; and
   the one or more control circuits are configured to temporarily prevent the increase in the boosting of the channel region while applying the one or more voltages for a duration of time based on position of the memory cell selected for verification with respect to the first end of the selected group.

3. The non-volatile storage apparatus of claim 1, further comprising:
   word lines, the non-volatile memory cells are arranged in groups of connected non-volatile memory cells, the word lines are connected to the groups of connected non-volatile memory cells; and
   the first zone includes a first set of word lines and the second zone includes a second set of word lines.

4. The non-volatile storage apparatus of claim 1, wherein:
   the non-volatile memory cells are arranged in NAND strings; and
   the first zone includes a first portion of the NAND strings and the second zone includes a second portion of the NAND strings.

5. The non-volatile storage apparatus of claim 1, further comprising:
   word lines, the non-volatile memory cells are arranged in groups of connected non-volatile memory cells, the one or more control circuits are configured to operate the word lines as at least two sets of word lines comprising a first set of word lines connected to the first side of the groups of connected non-volatile memory cells and a second set of word lines connected to the second side of the groups of connected non-volatile memory cells, the one or more control circuits are configured to temporarily prevent the increase in the boosting of the channel region for the first duration of time if the memory cell selected for verification is connected to the first set and for the second duration of time if the memory cell selected for verification is connected to the second set, the first set of word lines are in the first zone, the second set of word lines are in the second zone.

6. The non-volatile storage apparatus of claim 5, wherein: the word lines include a third set of word lines corresponding to a third zone, the one or more control circuits are configured to temporarily prevent the increase in the boosting of the channel region for a third duration of time if the memory cell selected for verification is connected to the third set of word lines.

7. The non-volatile storage apparatus of claim 1, further comprising:
word lines, the non-volatile memory cells are arranged in groups of connected non-volatile memory cells, the groups include a first side and a second side, the one or more control circuits are configured to operate the word lines as three sets of word lines comprising a first set of word lines connected to the first side of the groups of connected non-volatile memory cells and a second set of word lines connected to the second side of the groups of connected non-volatile memory cells as well as a third set of word lines between the first set and the second set, the one or more control circuits are configured to temporarily prevent the increase in the boosting of the channel region for the first duration of time if the memory cell selected for verification is connected to the first set and for the second duration of time if the memory cell selected for verification is connected to the second set, if the memory cell selected for verification is connected to the third set then the one or more control circuits are configured to temporarily prevent the increase in the boosting of the channel region for the first duration during some iterations of a programming process and for the second duration during other iterations of the programming process, the first set of word lines are in the first zone, the second set of word lines are in the second zone, the third set of word lines are in a third zone.

8. The non-volatile storage apparatus of claim 7, wherein: the groups of connected non-volatile memory cells are vertical NAND strings; and
the one or more control circuits are configured to program memory cells in the selected group in an order from the first side to the second side.

9. A non-volatile storage apparatus, comprising:
a plurality of non-volatile memory cells;
select gates;
word lines, the non-volatile memory cells are arranged in NAND strings that include one or more select gates, the word lines are connected to the non-volatile memory cells of the NAND strings;
select lines connected to the select gates;
one or more control circuits in communication with the memory cells, select gates, word lines and select lines;
the one or more control circuits are configured to program the memory cells and verify the programming;
wherein the one or more control circuits are configured to verify the programming by applying a voltage to one or more select lines for selected NAND strings to turn on one or more select gates for selected NAND strings, applying a voltage to one or more select lines for unselected NAND strings to turn off one or more select gates for unselected NAND strings, applying and increasing a boosting voltage to unselected word lines to boost channels of unselected NAND strings such that the unselected word lines are connected to the selected NAND strings and the unselected NAND strings, applying a compare voltage to a selected word line connected to the selected NAND strings and the unselected NAND strings, sensing a threshold voltage of selected memory cells in the selected NAND strings in response to the compare voltage, and while increasing the boosting voltage, temporarily changing the voltage applied to the select lines for unselected NAND strings to temporarily turn on the select gates for unselected NAND strings in order to interrupt boosting of the channels of the unselected NAND strings for a duration of time based on position of the selected word line.

10. The non-volatile storage apparatus of claim 1, wherein:
the one or more control circuits are configured to temporarily prevent the increase in the boosting of the channel region by interrupting the boosting after it has started and subsequently allowing the boosting to continue.

11. The non-volatile storage apparatus of claim 1, wherein:
the unselected memory cell is part of a NAND string; and
the channel region associated with the unselected memory cell is a channel region for the NAND string.

12. The non-volatile storage apparatus of claim 1, wherein:
the plurality of non-volatile memory cells are arranged in a monolithic three dimensional memory structure.

13. The non-volatile storage apparatus of claim 1, wherein:
the plurality of non-volatile memory cells are arranged in vertical NAND strings of a monolithic three dimensional memory structure.

14. A method of operating non-volatile storage, comprising:
programming non-volatile memory cells; and
verifying the programming, the verifying the programming comprises:
applying a voltage to one or more select gates for selected groups of memory cells to turn on the one or more select gates for selected groups of memory cells,
applying a voltage to one or more select gates for unselected groups of memory cells to turn off the one or more select gates for the unselected groups of memory cells,
applying and increasing a boosting voltage to unselected control lines to boost channels of unselected groups of memory cells, the unselected control lines are connected to the selected groups of memory cells and the unselected groups of memory cells,
applying a compare voltage to a selected control line connected to the selected groups of memory cells and the unselected groups of memory cells,
sensing a threshold voltage of selected memory cells in the selected groups of memory cells in response to the compare voltage, and
while increasing the boosting voltage, temporarily changing the voltage applied to the select gates for unselected groups of memory cells to temporarily turn on the select gates for unselected groups of memory cells in order to prevent boosting of the channels of the unselected groups of memory cells for a duration of time based on position of the selected control line.

15. The method of claim 14, wherein:
the temporarily changing the voltage applied to the select gates for unselected groups of memory cells includes applying a voltage spike to the select gates for unselected groups of memory cells.

16. The method of claim 14, wherein:
the temporarily changing the voltage applied to the select gates for unselected groups of memory cells temporarily interrupts boosting that has already started.

17. The method of claim 14, wherein:
the unselected control lines and the selected control line are arranged as a group of control lines having a first edge and a second edge, memory cells connected to the unselected control lines and the selected control line are programmed from the first edge to the second edge, the group of control lines are divided into a first zone and a second zone, the first zone is closer to the first edge than the second zone; and
the duration of time is a first duration if the selected control line is in the first zone and a second duration if the selected control line is in the second zone, the first duration is longer than the second duration.

18. The method of claim 14, wherein:
the unselected control lines and the selected control line are arranged as a group of control lines having a first edge and a second edge, the group of control lines are divided into a first zone, a second zone and a third zone, the first zone is closer to the first edge than the second zone, the second zone is closer to the second edge than the first zone, the third zone is between the first zone and the second zone; and
the duration of time is a first duration if the selected control line is in the first zone and a second duration if the selected control line is in the second zone, the first duration is longer than the second duration, the duration of time is the first duration for some iterations of a programming process and the second duration for other iterations of the programming process if the selected word line is in the third zone.

19. The method of claim 14, wherein:
the control lines are word lines; and
the non-volatile memory cells are arranged in vertical NAND strings of a monolithic three dimensional memory structure.

20. A non-volatile storage apparatus, comprising:
a plurality of word lines;
a plurality of groups of connected non-volatile memory cells connected to the word lines; and
one or more control circuits in communication with the groups of connected memory cells and the word lines, the one or more control circuits configured to program the memory cells and verify the programming;
to verify the programming the one or more control circuits are configured to apply one or more voltages that increase over time to the word lines in order to perform boosting of a channel region associated with an unselected group of connected memory cells and initially allow the boosting of the channel region for a portion of time while applying the one or more voltages that increase in time, the one or more control circuits are configured to apply a compare signal to a memory cell selected for verification and unselected memory cells connected to a selected word line and perform a sensing operation for the memory cell selected for verification in response to the compare signal, the one or more control circuits are configured to temporarily interrupt the boosting for a period of time based on word line position of the selected word line such that the period of time is a first amount of time if the selected word line is in a first zone of word lines and the period of time is a second amount of time if the selected word line is in a second zone of word lines, the first amount of time is greater than the second amount of time, the second amount of time is greater than zero.

* * * * *